(12) United States Patent
Ramaswami et al.

(10) Patent No.: US 10,616,535 B1
(45) Date of Patent: Apr. 7, 2020

(54) SUB-SAMPLED COLOR CHANNEL READOUT WIRING FOR VERTICAL DETECTOR PIXEL SENSORS

(71) Applicant: Foveon, Inc., San Jose, CA (US)

(72) Inventors: Shrinath Ramaswami, San Jose, CA (US); Tatsuya Inui, Kawasaki (JP); Shigemi Yamazaki, Kawasaki (JP); Jonathan Yu, Union City, CA (US); Glenn Keller, West Chester, PA (US)

(73) Assignee: Foveon, Inc., San Jose, CA (US)

( * ) Notice: Subject to any disclaimer, the term of this patent is extended or adjusted under 35 U.S.C. 154(b) by 0 days.

(21) Appl. No.: 16/148,951

(22) Filed: Oct. 1, 2018

(51) Int. Cl.
| | |
|---|---|
| *H04N 9/04* | (2006.01) |
| *H01L 27/146* | (2006.01) |
| *H04N 5/378* | (2011.01) |
| *H04N 5/376* | (2011.01) |
| *H04N 5/374* | (2011.01) |

(52) U.S. Cl.
CPC ... *H04N 9/04511* (2018.08); *H01L 27/14645* (2013.01); *H04N 5/376* (2013.01); *H04N 5/378* (2013.01); *H04N 9/04557* (2018.08); *H04N 5/374* (2013.01)

(58) Field of Classification Search
CPC ........ H04N 5/374; H04N 5/376; H04N 5/378; H04N 9/0451; H04N 9/04511; H04N 9/04557; H01L 27/14645; H01L 27/14643
See application file for complete search history.

(56) References Cited

U.S. PATENT DOCUMENTS

| | | | | |
|---|---|---|---|---|
| 6,960,757 | B2 * | 11/2005 | Merrill | H01L 27/14621 250/208.1 |
| 7,623,163 | B2 * | 11/2009 | Neter | H04N 5/3454 348/222.1 |
| 8,120,669 | B2 * | 2/2012 | Meitav | H04N 1/32128 348/207.1 |
| 9,237,282 | B2 * | 1/2016 | Kanemitsu | H04N 5/35563 |
| 10,225,496 | B2 * | 3/2019 | Ogura | H01L 27/14621 |
| 2010/0013969 | A1 * | 1/2010 | Ui | H04N 5/35545 348/294 |

* cited by examiner

*Primary Examiner* — Ngoc Yen T Vu
(74) *Attorney, Agent, or Firm* — Glass and Associates; Kenneth D'Alessandro; Kenneth Glass

(57) ABSTRACT

In an array containing rows and columns of multi-color vertical detector color pixel sensors disposed in a rows and columns of the array, a readout wiring architecture includes a plurality of row-select lines for each row of the array, equal to the number of colors in the vertical detector color pixel sensors, an individual column line for each column, a transfer transistor for each individual color detector coupled between a color detector and a column line associated with the column in which the color detector is disposed. Each transfer transistor has a gate coupled to one of the plurality of row-select lines in a row in which the vertical detector color pixel sensor is disposed. The gates of at least some of the transfer transistors in each row for each color detector in adjacent columns of the array are coupled to different ones of the row-select lines for that row.

12 Claims, 11 Drawing Sheets

Readout time for each row = t
Readout time for two rows 3 colors = 2t

|       | C0  | C1 | C2 | C3 | C4 |
|-------|-----|----|----|----|----|
ROW i

| TG0 | R | G | R | G | R |
| TG1 | G | R | G | R | G |
| TG2 | B | B | B | B | B |

ROW i+1

| TG0 | R | R | R | R | R |
| TG1 | G | B | G | B | G |
| TG2 | B | G | B | G | B |

FIG. 4

| | C0 | C1 | C2 | C3 | C4 | C5 |
|---|---|---|---|---|---|---|
| TG0 | G0 | B0 | R3 | G3 | B3 | xxx |
| TG1 | R1 | G1 | B1 | R4 | G4 | B4 |
| TG2 | xxx | R2 | G2 | B2 | R5 | G5 |

|     | C0 | C1 | C2 | C3 | C4 |
|-----|----|----|----|----|----|
| TG0 | R0 | B1 | G2 | R3 | R4 |
| TG1 | G0 | R1 | B2 | G3 | G4 |
| TG2 | B0 | G1 | R2 | B3 | B4 |

|  | C0 | C1 | C2 | C3 | C4 |
|---|---|---|---|---|---|
| TG0 | R0 | G1 | B2 | R3 | G4 |
| TG1 | G0 | B1 | R2 | G3 | B4 |
| TG2 | B0 | R1 | G2 | B3 | R4 |

|     | C0 | C1 | C2 | C3 | C4 |
|-----|----|----|----|----|----|
| TG0 | R0 | G1 | B2 | G3 | R4 |
| TG1 | G0 | B1 | R2 | B3 | G4 |
| TG2 | B0 | R1 | G2 | R3 | B4 |

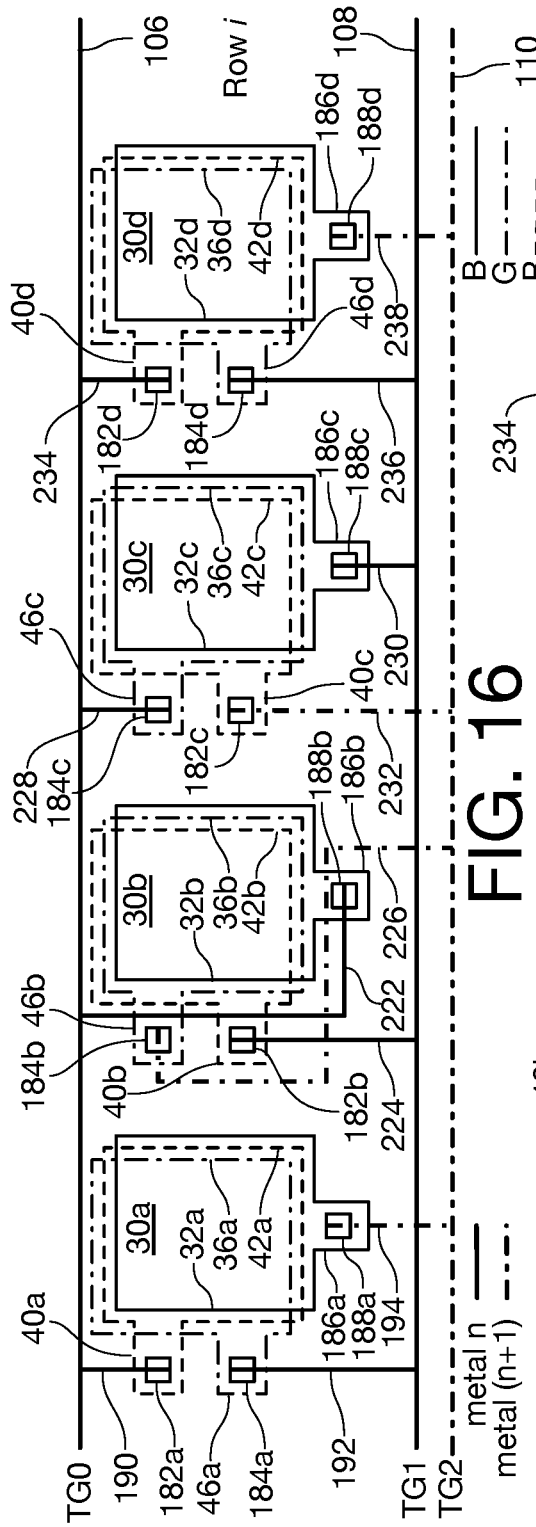
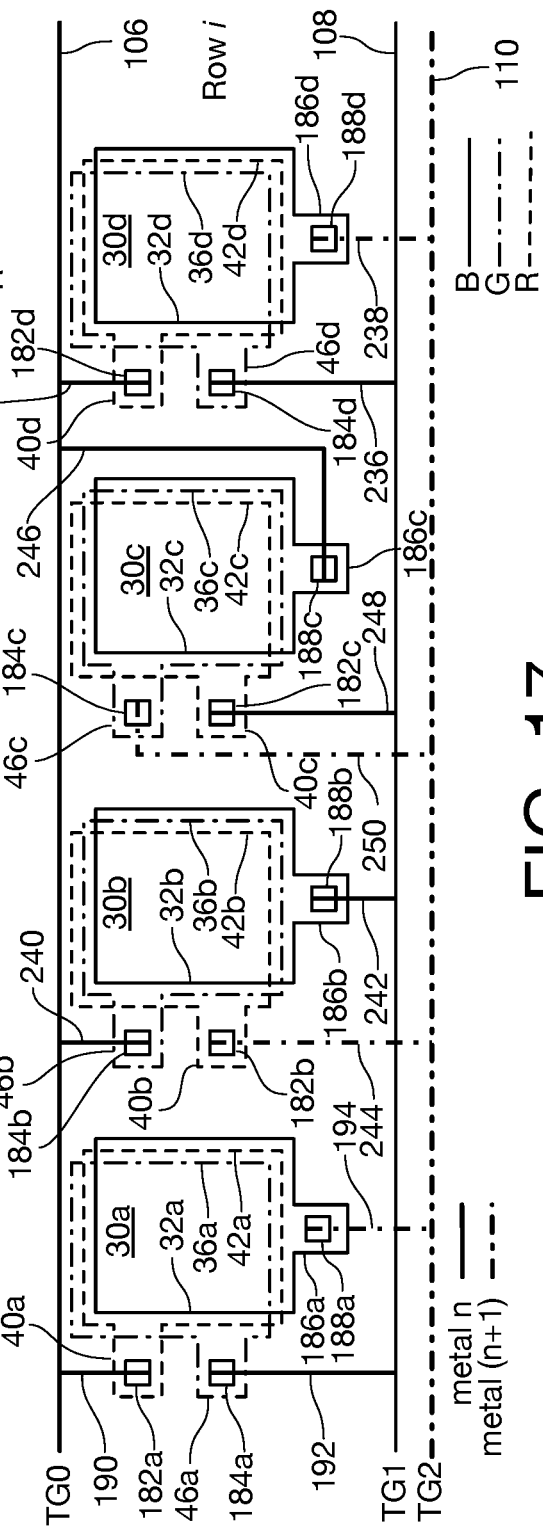

SUB-SAMPLED COLOR CHANNEL READOUT WIRING FOR VERTICAL DETECTOR PIXEL SENSORS

The present invention relates to pixel sensors. More particularly, the present invention relates to color pixel sensors and especially to vertical three-color pixel sensors such as pixel sensors in imaging arrays designed and fabricated by Foveon, Inc. of San Jose, Calif. and to row/column readout wiring for such imaging arrays.

BACKGROUND

Vertical color pixel sensors such as the Foveon X3® sensor produce images have a very high information content. This property is good for producing high quality still images, but generates a large amount of data per image. The requirement to transfer large amounts of data from the imaging array places restrictions on the frame rate, which is particularly limiting for recording video.

Many prior-art imaging systems employ mosaic imagers such as Bayer pattern imagers. A single "pixel" in a Bayer pattern imager is actually four pixel sensors, two green sensors, one red sensor, and one blue sensor. Two color pixels of a Bayer pattern imager are depicted in FIG. 1, a top view of a typical Bayer pattern color pixel sensor layout. A first color pixel includes red sensor 10, green sensors 12 and 14 and blue sensor 16. A second color pixel includes red sensor 18, green sensors 20 and 22 and blue sensor 24. Each color pixel occupies two adjacent rows, shown in FIG. 1 as Row i and Row (i+1). If the readout time per row is t, then the readout time for three colors in a single pixel requires reading two rows and is equal to 2t.

A simplified cross section of a color CMOS image sensor 30, such as a Foveon X3® color pixel sensor, including three horizontally aligned vertical color pixel sensors disposed at different depths in a semiconductor substrate is depicted in FIG. 2A. A blue sensor 32 is located at or near the surface of a semiconductor substrate or well. Contact is made to the blue sensor 32 via contact region 34. A green sensor 36 is located in the semiconductor substrate or well beneath and horizontally aligned with the blue sensor 32. Contact is made to the green sensor 36 via contact region 38 formed at the top of contact plug 40. A red sensor 42 is located in the semiconductor substrate or well beneath and horizontally aligned with the blue sensor 32 and the green sensor 36. Contact is made to the red sensor 42 via contact region 44 formed at the top of contact plug 46. The blue, green, and red pixel sensors are formed as photodiodes as is known in the art.

Referring now to FIG. 2B, a simplified schematic diagram of a portion of an array of pixel sensors such as the one depicted in FIG. 2A shows an illustrative prior-art row and column wiring scheme for operating the array. The array includes two rows, Row i and Row (i+1), and four columns of pixel sensors, C0, C1, C2, and C3. The pixel sensor at Row i, column C0 is identified by dashed line 50.

The individual color pixel sensors are shown as rectangles in FIG. 2B. A pixel (shown in dashed lines 50) includes a red sensor 52, a green sensor 54, and a blue sensor 56. Red sensor 52 is coupled to column line C0 (reference numeral 58) via transfer transistor 60, whose gate is driven by transfer gate line TGir at reference numeral 62. Green sensor 54 is coupled to column line C0 58 via transfer transistor 64, whose gate is driven by transfer gate line TGig at reference numeral 66. Blue sensor 56 is coupled to column line C0 58 via transfer transistor 68, whose gate is driven by transfer gate line TGib at reference numeral 70. Persons of ordinary skill in the art will appreciate that the other pixels (undesignated by reference numerals in FIG. 2B), are usually identical to pixel 50.

The readout process for the array depicted in FIG. 2B places the outputs of the red, green and blue sensors 52, 54, and 56 on the column line C0 58 one at a time by activating one of the transfer gate lines 62 (red), 66 (green), and 70 (blue). Persons of ordinary skill in the art will readily appreciate that the accumulated charge from the individual color pixel sensors in the other columns (C1, C2, and C3) of Row i will also be read out simultaneously with the accumulated charges of sensors 52, 54, and 56 as detailed above and that the pixel sensors in other rows of the array may then be read using the same operations as detailed for Row i herein. Persons of ordinary skill in the art will also readily appreciate that other steps, such as pixel reset and dark level read operations, will be involved in operation of the array, but these steps are not detailed here in order to avoid overcomplicating the disclosure and thus obscuring the invention.

The architecture shown in FIG. 2B utilizes three transfer gate lines (62, 66, and 70) per row and a single column line (e.g., C0 58) per column. Using the row readout time t of the Bayer pattern sensor example of FIG. 1, the time to read out one row of the array of FIG. 2B is 3t. These three passes are required to capture all three colors for each row. One advantage of the architecture of FIG. 2B is that is does not have color aliasing.

BRIEF DESCRIPTION

According to the various aspects of the present invention, by wiring the pixel readout in accordance with the present invention, two readout modes can be employed. A sparse sampling pattern can be used for video, without affecting the data density for high-quality still images. Since the sparse sampling doubles the number of color channels that are read out with each pass, the frame rate doubles. A full sampling pattern can also be employed, in order to take advantage of the full data density afforded by vertical color image sensors such as the Foveon X3®.

According to one aspect of the present invention, in an array that includes rows and columns of vertical detector color pixel sensors, each vertical detector color pixel sensor disposed in a row and column of the array and having individual color detectors for a number of colors, a readout wiring architecture includes a plurality of row-select lines for each row of the array, the number of row-select lines equal to the number of colors in the vertical detector color pixel sensors in the array. An individual column line is provided for each column of the array. A transfer transistor is provided for each individual color detector in each vertical detector color pixel sensor in the array. Each transfer transistor is coupled between a color detector disposed in a column of the array and a column line associated with the column of the array in which the color detector is disposed. Each transfer transistor has a gate coupled to one of the plurality of row-select lines in a row of the array in which the vertical detector color pixel sensor is disposed. The gates of at least some of the transfer transistors in each row of the array for each color detector in adjacent columns of the array are coupled to different ones of the row-select lines for that row of the array.

According to another aspect of the present invention, for each row in the array, the coupling of gates of transfer transistors to row-select lines repeats in groups of three consecutive columns in which gates of transfer transistors in a first consecutive column of the array for each color are coupled to the row-select lines in a first order, gates of transfer transistors in a second consecutive column of the array for each color are coupled to the row-select lines in a second order different from the first order, and gates of transfer transistors in a third consecutive column of the array for each color are coupled to the row-select lines in a third order different from the first and second orders.

According to another aspect of the present invention, in the first consecutive column, the gate of the transfer transistor for a first color detector is coupled to a first row-select line, the gate of the transfer transistor for a second color detector is coupled to a second row-select line, and the gate of the transfer transistor for a third color detector is coupled to a third row-select line, in the second consecutive column, the gate of the transfer transistor for the first color detector is coupled to the third row-select line, the gate of the transfer transistor for the second color detector is coupled to the first row-select line, and the gate of the transfer transistor for the third color detector is coupled to the second row-select line, and in the third consecutive column, the gate of the transfer transistor for the first color detector is coupled to the second row-select line, the gate of the transfer transistor for the second color detector is coupled to the third row-select line, and the gate of the transfer transistor for the third color detector is coupled to the first row-select line.

According to another aspect of the present invention, for each row in the array, the coupling of gates of transfer transistors to row-select lines repeats in groups of four consecutive columns in which gates of transfer transistors in a first consecutive column of the array for each color are coupled to the row-select lines in a first order, gates of transfer transistors in a second consecutive column of the array for each color are coupled to the row-select lines in a second order different from the first order, gates of transfer transistors in a third consecutive column of the array for each color are coupled to the row-select lines in a third order different from the first and second orders, and gates of transfer transistors in a fourth consecutive column of the array for each color are coupled to the row-select lines in the first order.

According to another aspect of the present invention, in the first consecutive column, the gate of the transfer transistor for a first color detector is coupled to a first row-select line, the gate of the transfer transistor for a second color detector is coupled to a second row-select line, and the gate of the transfer transistor for a third color detector is coupled to a third row-select line, in the second consecutive column, the gate of the transfer transistor for the first color detector is coupled to the second row-select line, the gate of the transfer transistor for the second color detector is coupled to the third row-select line, and the gate of the transfer transistor for the third color detector is coupled to the first row-select line, in the third consecutive column, the gate of the transfer transistor for the first color detector is coupled to the third row-select line, the gate of the transfer transistor for the second color detector is coupled to the first row-select line, and the gate of the transfer transistor for the third color detector is coupled to the second row-select line, and in the fourth consecutive column, the gate of the transfer transistor for the first color detector is coupled to the first row-select line, the gate of the transfer transistor for the second color detector is coupled to the second row-select line, and the gate of the transfer transistor for the third color detector is coupled to the third row-select line.

According to another aspect of the present invention, for each ith row in the array, the transfer transistors in each ith column of the array for each color are coupled to the row-select lines in a first order and the transfer transistors in each (i+1)th column of the array for each color are coupled to the row-select lines in a second order different from the first order, and for each (i+1)th row in the array, the transfer transistors in each ith column of the array for each color are coupled to the row-select lines in the first order and the transfer transistors in each (i+1)th column of the array for each color are coupled to the row-select lines in a third order different from the first and second orders.

According to another aspect of the present invention, the gates of the transfer transistors in an ith row of the array for a first color and a second color alternate between a first row select line and a second row select line in adjacent columns of the array, and the gates of the transfer transistors in the ith row of the array for a third color are coupled to a third row select line for all columns in the array, and the gates of the transfer transistors in an (i+1)th row of the array for the first color are coupled to a first row select line for all columns in the array, and the gates of the transfer transistors in the (i+1)th row of the array for the second color and the third color alternate between a second row select line and a third row select line in adjacent columns of the array.

According to another aspect of the present invention, an array includes rows and columns of vertical detector color pixel sensors, each vertical detector color pixel sensor disposed in a row and column of the array and having individual color detectors for a number of colors. A readout wiring architecture includes a plurality of row-select lines for each row of the array, the number of row-select lines equal to the number of colors in the vertical detector color pixel sensors in the array. An individual column line is provided for each column of the array. A transfer transistor is provided for each individual color detector in each vertical detector color pixel sensor in the array, each transfer transistor is coupled between a color detector in a column of the array and a column line of the array and has a gate coupled to one of the plurality of row-select lines in a row of the array in which the vertical detector color pixel sensor is disposed. The transfer transistors for each color detector in a vertical detector color pixel sensor in a column of the array are coupled to a different one of the column line immediately preceding the column line in which the vertical detector color pixel sensor is disposed, the column line in which the vertical detector color pixel sensor is disposed, and the column line immediately following the column line in which the vertical detector color pixel sensor is disposed.

According to another aspect of the present invention, the transfer transistor for a first color detector in a vertical detector color pixel sensor in a column of the array is coupled to the column line immediately preceding the column line in which the vertical detector color pixel sensor is disposed, the transfer transistor for a second color detector in a vertical detector color pixel sensor in a column of the array is coupled to the column line in which the vertical detector color pixel sensor is disposed, and the transfer transistor for a third color detector in a vertical detector color pixel sensor in a column of the array is coupled to the column line immediately following the column line in which the vertical detector color pixel sensor is disposed.

According to another aspect of the present invention, a method is disclosed for operating in a video mode an array containing rows and columns of vertical detector color pixel sensors, each vertical detector color pixel sensor having individual red, green, and blue color detectors, each red color detector in a vertical detector color pixel sensor in a column of the array coupled to a column output line through a red transfer transistor, each green color detector in a vertical detector color pixel sensor in a column of the array coupled to a column output line through a green transfer transistor, each blue color detector in a vertical detector color pixel sensor in a column of the array coupled to a column output line through a blue transfer transistor, gates of each red transfer transistor in a row of the array coupled to a red transfer row line, gates of each green transfer transistor in a row of the array coupled to a green transfer row line, gates of each blue transfer transistor in a row of the array coupled to a blue transfer row line. The method includes sequentially turning on the red and green transfer transistors in every ith row of the array, and sequentially turning on the green and blue transfer transistors in every (i+8)th row of the array.

BRIEF DESCRIPTION OF THE DRAWING FIGURES

The invention will be explained in more detail in the following with reference to embodiments and to the drawing in which are shown:

FIG. 4 is a table showing the outputs on the column lines of the array depicted in FIG. 3;

Figure 2A:
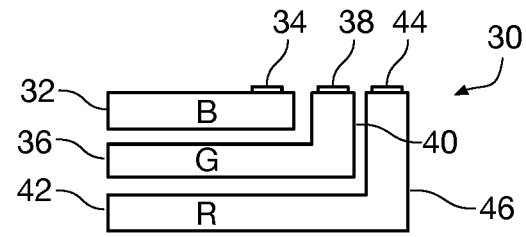
FIG. 2A is a simplified cross section of a color CMOS image sensor including three horizontally aligned color pixel sensors disposed at different depths in a semiconductor substrate.
Figure 14:
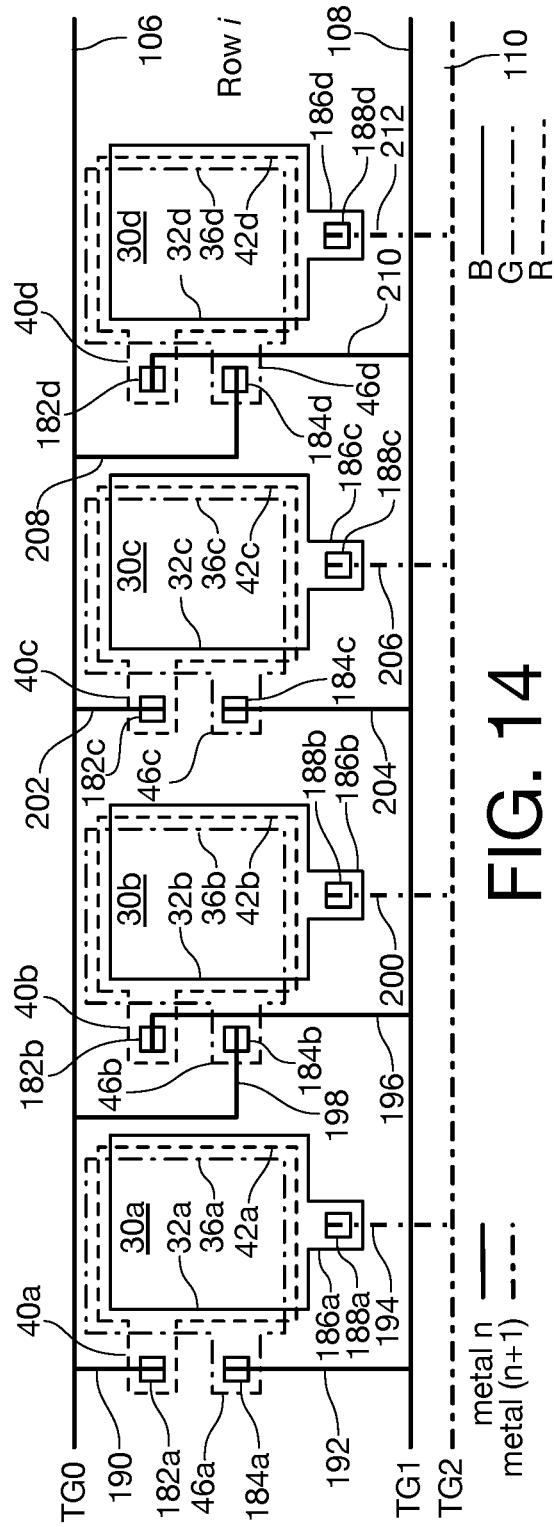
Figure 15:
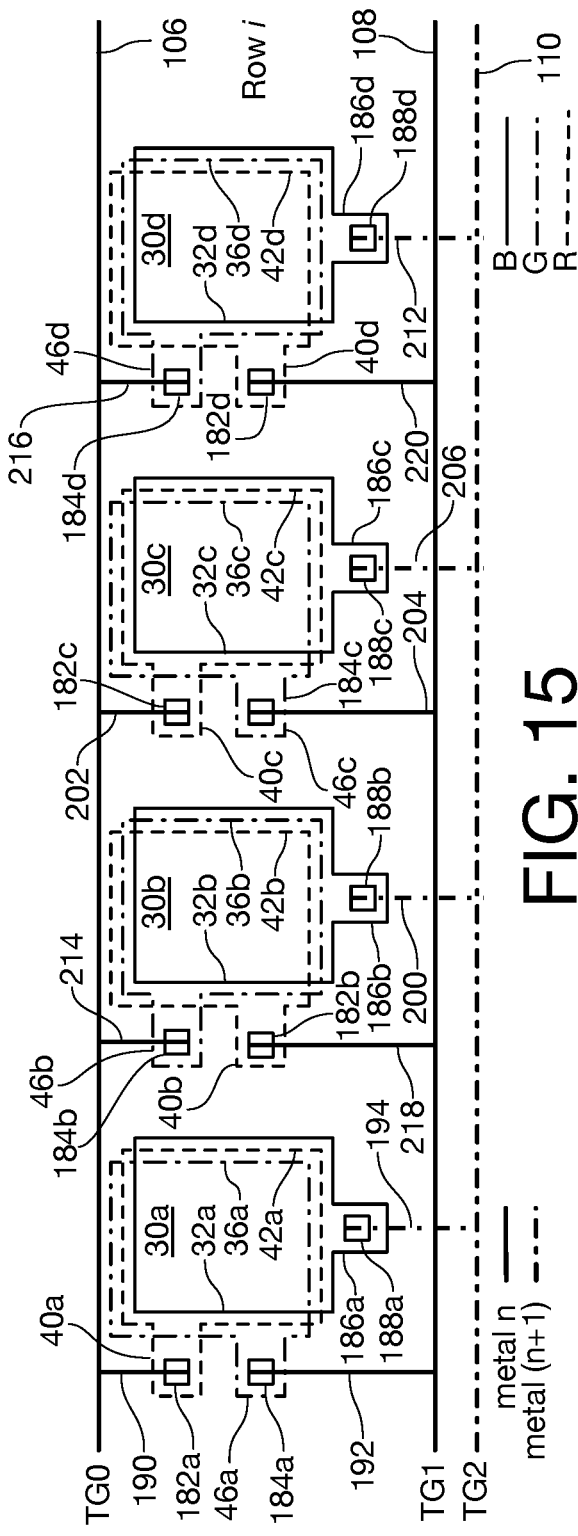

FIG. 14 is a top view of a simplified portion of a prior-art layout of a pair of vertical pixel sensors like those of FIG. 2A in a row of an array of such pixel sensors showing the positioning of the plugs used to transfer the charge from the buried red and green sensors; and FIG. 15 is a top view of a simplified portion of a layout of a pair of vertical pixel sensors like those of FIG. 2A in a row of an array of such pixel sensors showing the positioning of the plugs used to transfer the charge from the buried red and green sensors in accordance with an aspect of the present invention.

FIG. 16 is a top view of a simplified portion of a layout of a pair of vertical pixel sensors like those of FIG. 2A in a row of an array of such pixel sensors showing the positioning of the plugs used to transfer the charge from the buried red and green sensors in accordance with an aspect of the present invention.

FIG. 17 is a top view of a simplified portion of a layout of a pair of vertical pixel sensors like those of FIG. 2A in a row of an array of such pixel sensors showing the positioning of the plugs used to transfer the charge from the buried red and green sensors and the positioning of the contact for the blue sensor in accordance with an aspect of the present invention.

Figure 18:
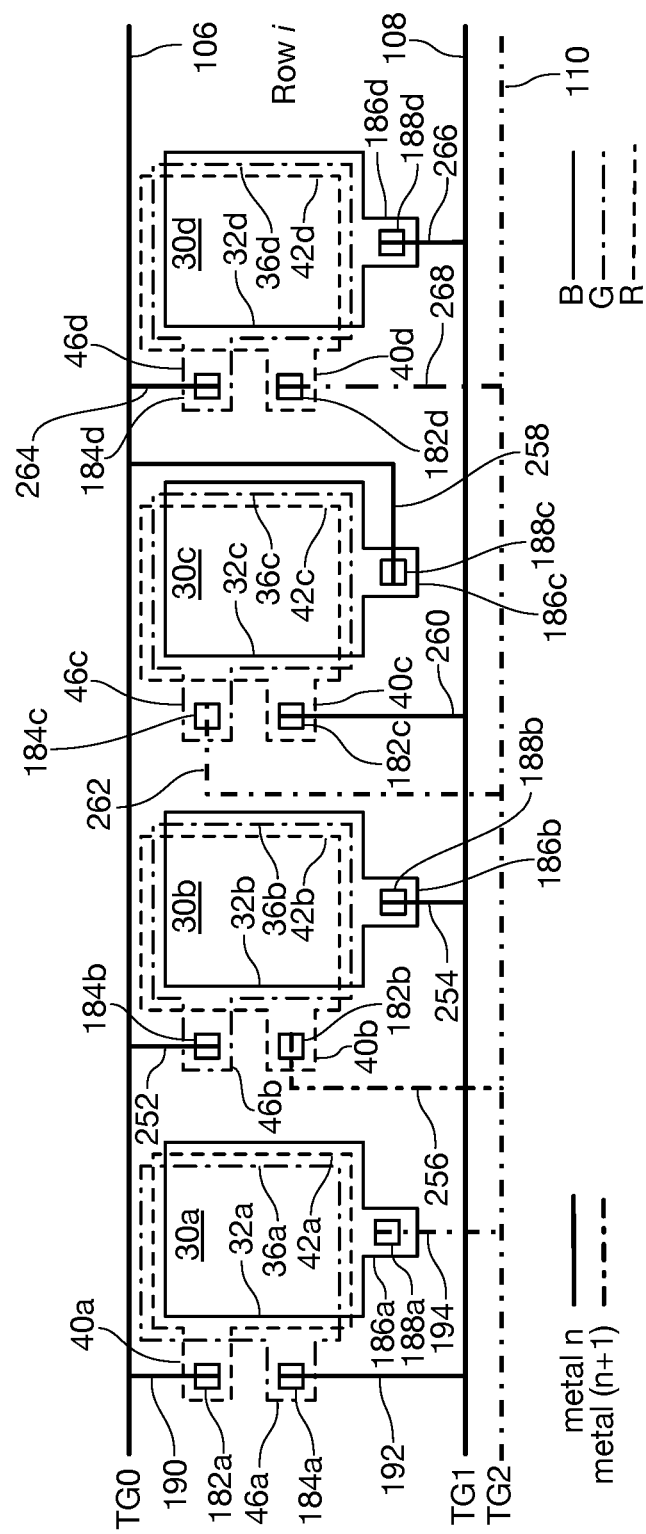

FIG. 18 is a top view of a simplified portion of a layout of a pair of vertical pixel sensors like those of FIG. 2A in a row of an array of such pixel sensors showing the positioning of the plugs used to transfer the charge from the buried red and green sensors and the positioning of the contact for the blue sensor in accordance with an aspect of the present invention.

DETAILED DESCRIPTION

Persons of ordinary skill in the art will realize that the following description of the present invention is illustrative only and not in any way limiting. Other embodiments of the invention will readily suggest themselves to such skilled persons.

Figure 3:
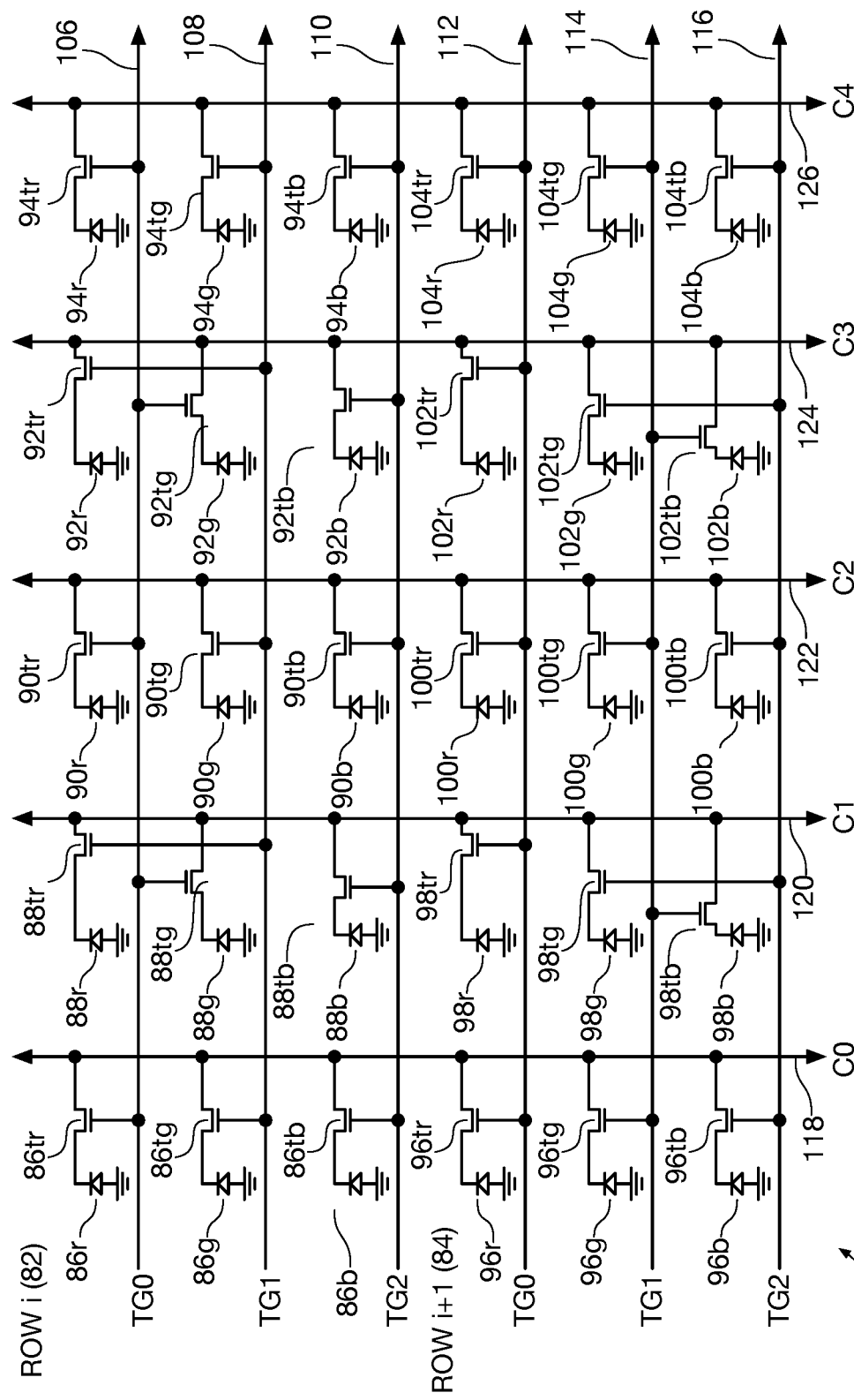
FIG. 3 is a simplified schematic diagram showing a portion of an array of pixel sensors such as the one depicted in FIG. 2A with an illustrative row and column wiring architecture for operating the array in accordance with an aspect of the present invention.

Referring now to FIG. 3, a wiring architecture is depicted for an adjacent pair of rows 82 and 84 of 3-color vertical pixel sensors in a pixel sensor array 80 in accordance with one aspect of the present invention. Each 3-color pixel sensor includes a red pixel sensor, a green pixel sensor, and a blue pixel sensor for red, green, and blue color sensing. Each pixel sensor will be identified by a reference numeral that is indicative of its pixel and color. Thus, for example, the red pixel sensor in 3-color pixel sensor 86 will be identified by reference numeral 86r, the green pixel sensor in 3-color pixel sensor 86 will be identified by reference numeral 86g, and the blue pixel sensor in 3-color pixel sensor 86 will be identified by reference numeral 86b. The numbering for the other pixel sensors follows this convention.

The first row i (82) includes five columns of 3-color pixel sensors, 86r, 86g, and 86b forming a first 3-color pixel sensor, 88r, 88g, and 88b forming a second 3-color pixel sensor, 90r, 90g, and 90b forming a third 3-color pixel sensor, 92r, 92g, 92b forming a fourth 3-color pixel sensor, and 94r, 94g, and 94b forming a fifth 3-color pixel sensor. Similarly, the second row i+1 (84) includes five 3-color pixel sensors, 96r, 96g, and 96b forming a first 3-color pixel sensor, 98*r*, 98*g*, and 98*b* forming a second 3-color pixel sensor, 100*r*, 100*g*, and 100*b* forming a third 3-color pixel sensor, 102*r*, 102*g*, 102*b* forming a fourth 3-color pixel sensor, and 104*r*, 104*g*, and 104*b* forming a fifth 3-color pixel sensor.

Each row in the array has three transfer gate lines. The three transfer gate lines for row 82 are identified by reference numerals 106 (TG0), 108 (TG1), and 110 (TG2), respectively. The three transfer gate lines for row 84 are identified by reference numerals 112 (TG0), 114 (TG1), and 116 (TG2), respectively.

Each column in the array has a column output line. The column output line for column C0 is identified by reference numeral 118. The column output line for column C1 is identified by reference numeral 120. The column output line for column C2 is identified by reference numeral 122. The column output line for column C3 is identified by reference numeral 124. The column output line for column C4 is identified by reference numeral 126.

Each individual color pixel sensor is connected to a column output line of the column with which it is associated through a transfer transistor. Each transfer transistor will be identified by a reference numeral that identifies its pixel followed by a suffix "t" and color identifier "r" for red, "g" for green, or "b" for blue. As an example, the transfer transistor for the red pixel sensor in pixel sensor 86 is identified as 86*tr*. The transfer transistors have their gates connected to one of the transfer gate lines 106, 108, 110, 112, 114, and 116 for activation in accordance with the architectures disclosed herein.

According to the aspect of the present invention depicted in FIG. 3, the pixel sensors of a first color and a second color in the first row 82 are alternately connected to first and second transfer gate lines 106 and 108 of that row through their respective transfer transistors. For example, red pixel sensors 86*r*, 90*r*, and 94*r* in odd columns (C0, C2 and, C4, reference numerals 118, 122, and 126, respectively) are connected to transfer gate TG0 106 through their respective transfer transistors 86*tr*, 90*tr*, and 94*tr* and green pixel sensors 88*g* and 92*g* in even columns in the first row 82 (shown as transfer transistors 88*tg* and 92*tg* for pixel sensors 66*g* and 92*g*) in even columns (C1 and C3, reference numerals 120 and 124, respectively) are connected to transfer gate TG0 106 through their respective transfer transistors 88*tg*, and 92*tg*. Red pixel sensors 88*r*, and 92*r*) in even columns (C1 and C3) are connected to transfer gate TG1 108 through their respective transfer transistors 88*tr*, and 92*tr* and green pixel sensors 86*g*, 90*g*, and 94*g* in odd columns in the first row 82 (C0, C2 and, C4) are connected to transfer gate TG0 106 through their respective transfer transistors 86*tg*, 90*tg*, and 94*tg*.

In the second row 84 of the adjacent pair of rows, all of the pixel sensors of the first color 96*r*, 98*r*, 100*r*, and 102*r* (red) are connected to the first transfer gate line TG0 112 of that row. The pixel sensors of the second color (green) and the third color (blue) are alternately connected to second and third ones of the transfer gate lines 114 and 116 of that row. For example, all pixel sensors of the second color 96*g*, 100*g* and 104*g* (green) in odd columns (C0, C2 and, C4, reference numerals 118, 122, and 124, respectively) and all pixel sensors of the third color 98*b* and 102*b* (blue) in even columns (C1 and C3, reference numerals 120, and 124, respectively) are connected to the second one TG1 114 of the transfer gate lines of that row and all pixel sensors of the third color 96*b*, 100*b*, and 104*b* (blue) in odd columns (C0, C2, and C4, reference numerals 118, 122, and 126, respectively) and all pixel sensors of the second color 98*g* and 102*g* (green) in even columns (C1 and C3, reference numerals 116, and 120, respectively) are connected to the third one TG2 116 of the transfer gate lines of that row.

The rows 82 and 84 are each shown for illustration purposes as having five vertical three-color pixel sensors but persons of ordinary skill in the art will appreciate that actual image sensors fabricated in accordance with the present invention may have an arbitrary number of rows and columns of pixel sensors. Persons of ordinary skill in the art will appreciate that the pattern of connections from the color pixel sensors to the transfer gate lines repeats in two-column groups. Thus, in FIG. 3, it may be seen that the connections on the first row i (82) from color pixel sensors 90*r*, 90*g*, 90*b*, to transfer gate lines 106, 108, and 110 in the third column C2, reference numeral 122, and the connections from color pixel sensors 94*r*, 94*g*, 94*b*, to transfer gate lines 106, 108, and 110 in the fifth column C4, reference numeral 126 are the same as the connections from color pixel sensors 86*r*, 86*g*, and 86*b* to transfer gate lines 106, 108, and 110 in the first column C0, reference numeral 118. The same is true for the connections between the color pixel sensors 88*r*, 88*g*, and 88*b* and color pixel sensors 92*r*, 92*g*, and 92*b* and the transfer gate lines 106, 108, and 110 in the second and fourth columns, respectively, of the first row i (82).

Similarly, in FIG. 3, it may be seen that the connections on the second row i+1 (84) from color pixel sensors 100*r*, 100*g*, 100*b*, to transfer gate lines 112, 114, and 116 in the third column C2, reference numeral 122, and the connections from color pixel sensors 104*r*, 104*g*, 104*b*, to transfer gate lines 106, 108, and 110 in the fifth column C4, reference numeral 126 are the same as the connections from color pixel sensors 96*r*, 96*g*, and 96*b* to transfer gate lines 106, 108, and 110 in the first column C0, reference numeral 118.

As can be seen from FIG. 3 and the above description, the pattern of row/column connections in both the first row i 82, and the second row i+1 84 repeat in adjacent two-column groups.

As shown in the table of FIG. 4, in the case of a particular embodiment illustrated in FIG. 3 where the first color is red, the second color is green, and the third color is blue, the colors are read out across the columns (extended to eight columns) in order as follows:

| Column Position | 0 | 1 | 2 | 3 | 4 | 5 | 6 | 7 |
| --- | --- | --- | --- | --- | --- | --- | --- | --- |
| Row i TG0 | R | G | R | G | R | G | R | G |
| Row i TG1 | G | R | G | R | G | R | G | R |
| Row i TG2 | B | B | B | B | B | B | B | B |
| Row (i + 1) TG0 | R | R | R | R | R | R | R | R |
| Row (i + 1) TG1 | G | B | G | B | G | B | G | B |
| Row (i + 1) TG2 | B | G | B | G | B | G | B | G |

If the readout time per row is t, then the total readout time for all three colors of each of the pixels in the two rows 82 and 84 for a still shot is 6t. This is exactly the same performance obtained by wiring the row transfer gate lines in accordance with prior-art practice.

To perform a video readout in a mosaic format, the first transfer gate 106 for row i 82 and the second transfer gate 114 for row (i+1) are activated and the colors read out across the columns are as follows and continues across the entire row:

| Column Position | 0 | 1 | 2 | 3 | 4 | 5 | 6 | 7 |
|---|---|---|---|---|---|---|---|---|
| Row i TG0 | R | G | R | G | R | G | R | G |
| Row (i + 1) TG1 | G | B | G | B | G | B | G | B |
| Row (i + 8) TG0 | R | G | R | G | R | G | R | G |
| Row (i + 9) TG1 | G | B | G | B | G | B | G | B |

As can be seen from the above table, this pattern is repeated every eight rows, in this example skipping rows (i+1) through (i+7) for transfer gate TG0 and skipping rows (i+2) through (i+8) for transfer gate TG1. The next rows to be read are (i+8) and (i+9). The next rows to be read in the same manner are rows (i+16) and (i+17), skipping rows (i+10) through (i+15).

Figure 1:
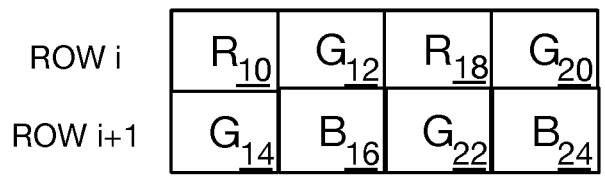
FIG. 1 is a top view depicting a typical mosaic color pixel sensor array such as a Bayer pattern sensor.

Persons of ordinary skill in the art will recognize this color readout to be the same as the color readout of the Bayer pattern mosaic sensor of FIG. 1. If the readout time per row is t, then the entire readout time for the four rows is 4t, twice as fast as a mosaic video readout with normal wiring.

Vertical color sensors such as the Foveon X3® having a single column readout line common to all three colors in the pixel have the ability to read out just one color channel per pass, with the color information sampled at each pixel location. A mosaic-filtered sensor (such as a Bayer pattern sensor) reads out 2 colors per pass, but it cannot sample the same color in each location. The aspect of the present invention described with reference to the readout wiring and operating modes illustrated in FIG. 3 combines these two operating modes, having the ability to act as a mosaic filter when speed is needed for applications such as video, and retaining the ability to provide full resolution by reading out all colors per pixel location when image quality is more important. This versatility of operation is accomplished with no penalty in power consumption.

An alternate video readout of the array shown in FIG. 3 that is neither standard X3 nor mosaic may be performed as shown in the table below:

| Column Position | 0 | 1 | 2 | 3 |
|---|---|---|---|---|
| Row i TG0 | R | G | R | G |
| Row (i + 5) TG2 | B | G | B | G |
| Row (i + 10) TG0 | R | G | R | G |
| Row (i + 15) TG2 | B | G | B | G |

This readout takes 2t*8/5 (3.2t) and is thus quicker than the mosaic readout at 4t at the cost of more aliasing.

Figures 5, 6:
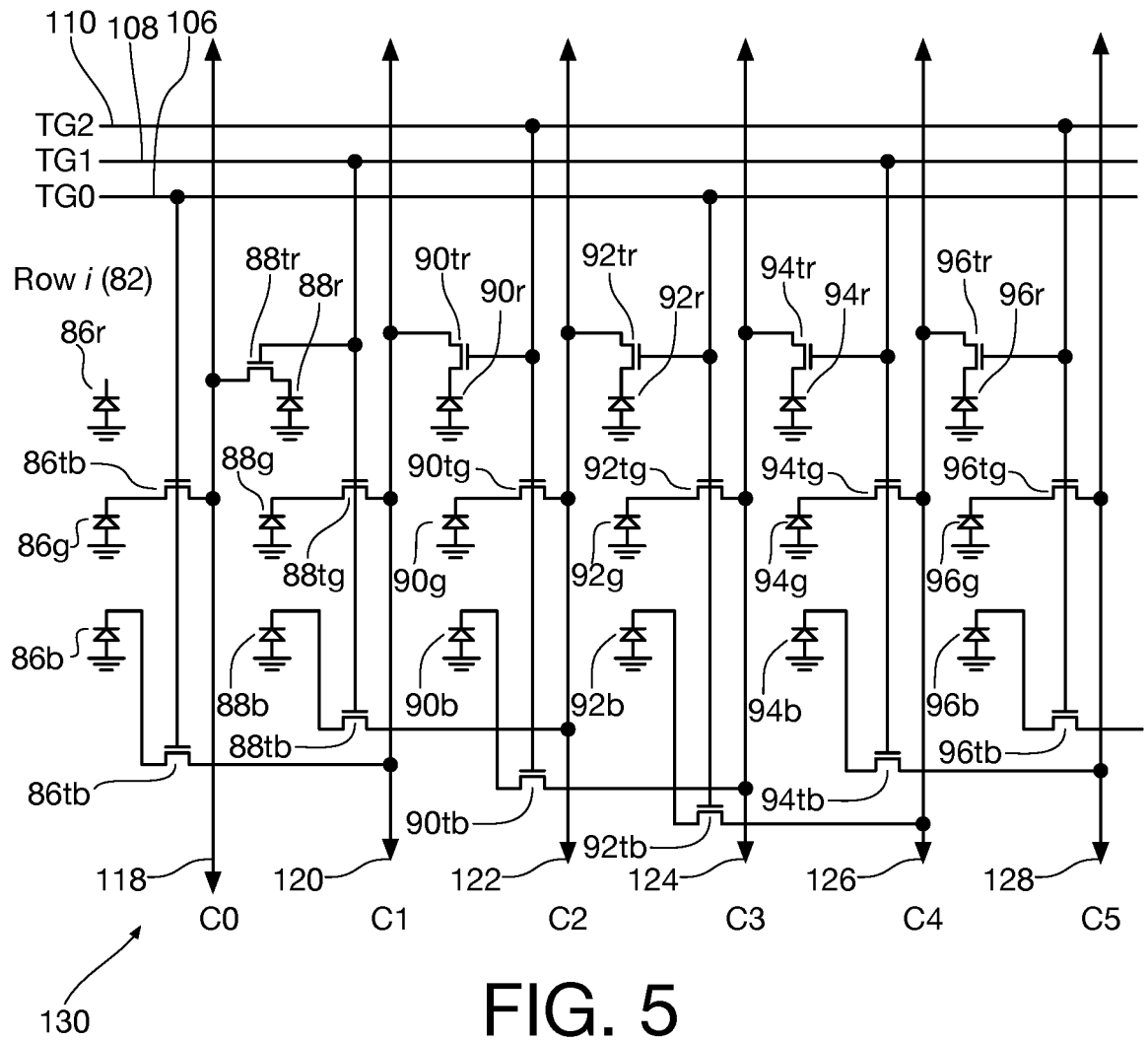
FIG. 5 is a simplified schematic diagram showing a portion of an array of pixel sensors such as the one depicted in FIG. 2A with an illustrative row and column wiring architecture for operating the array in accordance with another aspect of the present invention.
FIG. 6 is a table showing the outputs on the column lines of the array depicted in FIG. 5.

Referring now to FIG. 5, a wiring architecture is depicted for row i 82 of 3-color vertical pixel sensors in a pixel sensor array 130 in accordance with another aspect of the present invention. As in the embodiment depicted in FIG. 3, each 3-color pixel sensor in the embodiment depicted in FIG. 5 includes a red pixel sensor, a green pixel sensor, and a blue pixel sensor for individual red, green, and blue color sensing at the same location in the imaging array. Where elements of the imaging array depicted in FIG. 5 correspond to elements depicted in the imaging array of FIG. 3, they will be identified using the same reference numerals used in FIG. 3.

As may be seen from an examination of FIG. 5, the row i (82) includes six columns of 3-color pixel sensors, 86r, 86g, and 86b forming a first 3-color pixel sensor, 88r, 88g, and 88b forming a second 3-color pixel sensor, 90r, 90g, and 90b forming a third 3-color pixel sensor, 92r, 92g, 92b forming a fourth 3-color pixel sensor, 94r, 94g, and 94b forming a fifth 3-color pixel sensor, and 96r, 96g, and 96b forming a sixth 3-color pixel sensor.

Row 82 has three transfer gate lines TG0, TG1, and TG2. The three transfer gate lines for row 82 are identified, respectively, by reference numerals 106, 108, and 110, respectively.

Each column in the array has a column output line. The column output line for column C0 is identified by reference numeral 118. The column output line for column C1 is identified by reference numeral 120. The column output line for column C2 is identified by reference numeral 122. The column output line for column C3 is identified by reference numeral 124. The column output line for column C4 is identified by reference numeral 126. The column output line for column C5 is identified by reference numeral 128.

Each individual color pixel sensor is connected to a column output line of the column with which it is associated through a transfer transistor. As in the embodiment shown in FIG. 3, each transfer transistor in the embodiment depicted in FIG. 5 will be identified by a reference numeral that identifies its pixel followed by a suffix "t" and color identifier "r" for red, "g" for green, or "b" for blue. As an example, the transfer transistor for the red pixel sensor in pixel sensor 86 is identified as 86tr. Each of the transfer transistors has its gate connected to one of the transfer gate lines 106, 108, and 110 for pixel readout in accordance with the architectures disclosed herein.

Red pixel 86r is not coupled to any column line as indicated by the designation xxx in the table of FIG. 6. If C0 is not the first column in the array, red pixel 86r will be coupled to a preceding column line C(−1) by its transfer transistor (not shown).

Green pixel 86g is coupled to column output line C0 118 by transfer transistor 86tg having its gate connected to row line TG0 106. Blue pixel 86b is coupled to column output line C1 120 by transfer transistor 86tb having its gate connected to row line TG0 106.

Red pixel 88r (R1) is coupled to column output line C0 118 by transfer transistor 88tr having its gate connected to row line TG1 108. Green pixel 88g (G1) is coupled to column output line C1 120 by transfer transistor 88tg having its gate connected to row line TG1 108. Blue pixel 88b (B1) is coupled to column output line C2 122 by transfer transistor 88tb having its gate connected to row line TG1 108.

Red pixel 90r (R2) is coupled to column output line C1 120 by transfer transistor 90tr having its gate connected to row line TG2 110. Green pixel 90g (G2) is coupled to column output line C2 122 by transfer transistor 90tg having its gate connected to row line TG2 110. Blue pixel 90b (B2) is coupled to column output line C3 124 by transfer transistor 90tb having its gate connected to row line TG2 110.

Red pixel 92r (R3) is coupled to column output line C2 122 by transfer transistor 92tr having its gate connected to row line TG0 106. Green pixel 92g (G3) is coupled to column output line C3 124 by transfer transistor 92tg having its gate connected to row line TG0 106. Blue pixel 92b (B3) is coupled to column output line C4 126 by transfer transistor 92tb having its gate connected to row line TG0 106.

Red pixel 94r (R4) is coupled to column output line C3 124 by transfer transistor 94tr having its gate connected to row line TG1 108. Green pixel 94g (G4) is coupled to column output line C4 126 by transfer transistor 94tg having its gate connected to row line TG1 108. Blue pixel 94b (B4) is coupled to column output line C5 128 by transfer transistor 94tb having its gate connected to row line TG1 108.

Red pixel 96r (R5) is coupled to column output line C4 126 by transfer transistor 94tr having its gate connected to row line TG2 110. Green pixel 96g (G5) is coupled to column output line C5 128 by transfer transistor 96tg having its gate connected to row line TG2 110. Blue pixel 96*b* (B5) is coupled to a next column output line which would be C6 (not shown) by transfer transistor 96*tb* having its gate connected to row line TG2 110 as indicated by the designation xxx in the table of FIG. 6.

Persons of ordinary skill in the art will appreciate that, while a single row and six columns (two repeated patterns of three) are shown in FIG. 5 to illustrate this aspect of the present invention, imaging arrays configured in accordance with this aspect of the invention can have an arbitrary number of rows and columns.

As can be seen from the above description and an examination of FIG. 5, as well as an examination of the table of FIG. 6, to capture a still shot, row line TG1 (108) is activated, driving R1 (red pixel 88*r*), G1 (green pixel 88*g*), and B1 (blue pixel 88*b*) onto column lines C0, C1, and C2, respectively. Row line TG2 (110) is activated, driving R2 (red pixel 90*r*), G2 (green pixel 90*g*), and B2 (blue pixel 90*b*) onto column lines C1, C2, and C2, respectively. Row line TG0 (106) is activated, driving R3 (red pixel 92*r*), G3 (green pixel 92*g*), and B3 (blue pixel 92*b*) onto column lines C2, C3, and C4, respectively. The readout time for all three colors of each pixel is 3t for one row. This is exactly the same performance obtained by wiring the row transfer gate lines in accordance with prior-art practice for the conventional wiring shown in FIG. 2B. Note that incomplete pixels are only located at the columns on the edges of the array.

To perform a video readout in Foveon X3 format, row line TG1 (108) of row i is activated to drive green color pixels G1, G4, and G7 from columns 1, 4, 7, . . . and also the red color pixels R1, R4, and R7 from columns 0, 3, 6, and the blue color pixels B1, B4, and B7 from columns 2, 5, 8. This is repeated for row (i+8) and every eighth row following. The readout from each row takes a time 1t. This is three times faster than the prior art shown in FIG. 2B while giving X3 readout with no color aliasing.

Persons of ordinary skill in the art will note that the green pixel is always read out from the column line associated with its column, the red pixel is always read out from the column line associated with the previous column, and the blue pixel is always read out from the column line associated with the next column. Such skilled persons will also appreciate that while in this illustrative embodiment the red pixel is shifted to the left and the blue pixel is shifted to the right, any two of the colors could be shifted left and right, respectively, while the third color remains unshifted.

Figures 7, 8:
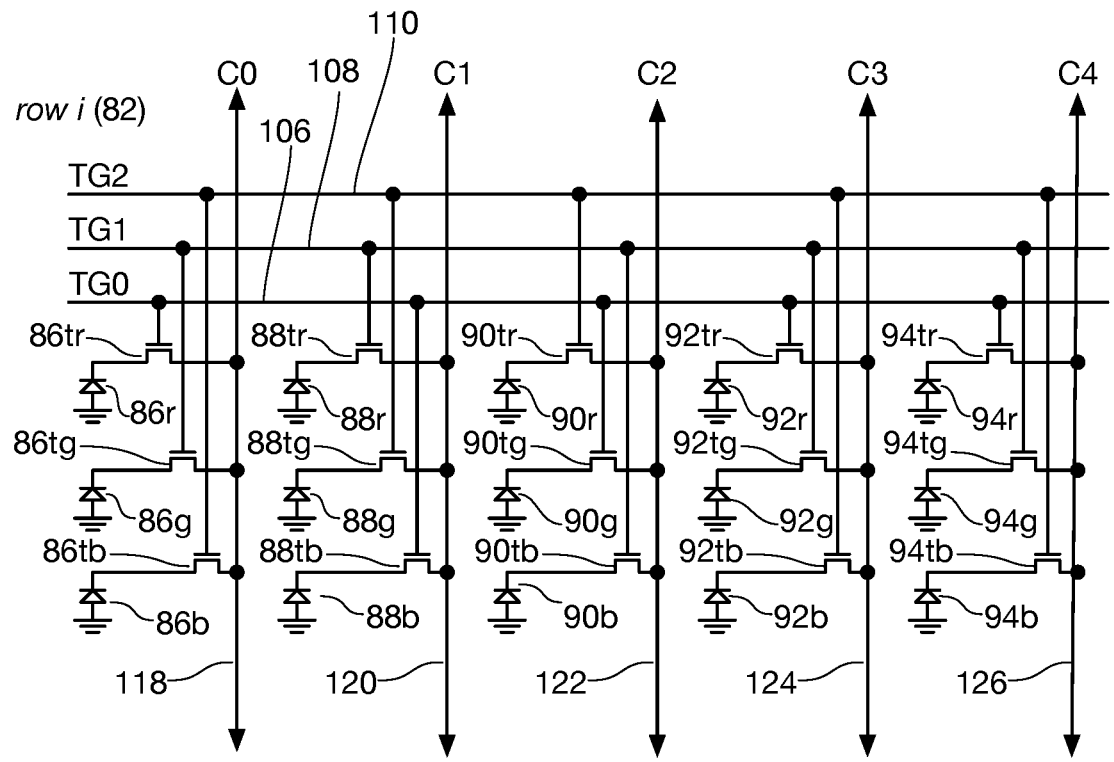
FIG. 7 is a simplified schematic diagram showing a portion of an array of pixel sensors such as the one depicted in FIG. 2A with an illustrative row and column wiring architecture for operating the array in accordance with another aspect of the present invention.
FIG. 8 is a table showing the outputs on the column lines of the array depicted in FIG. 7.

Referring now to FIG. 7, a wiring scheme is depicted for row i 82 of 3-color vertical pixel sensors in a pixel sensor array 140 in accordance with another aspect of the present invention. As in the embodiment depicted in FIG. 3, each 3-color pixel sensor in the embodiment depicted in FIG. 7 includes a red pixel sensor, a green pixel sensor, and a blue pixel sensor for individual red, green, and blue color sensing at the same location in the imaging array. Where elements of the imaging array depicted in FIG. 7 correspond to elements depicted in the imaging array of FIG. 3, they will be identified using the same reference numerals used in FIG. 3.

As may be seen from an examination of FIG. 7, the row i (82) includes five columns of 3-color pixel sensors, 86*r* (R0), 86*g* (G0), and 86*b* (B0) forming a first 3-color pixel sensor, 88*r* (R1), 88*g* (G1), and 88*b* (B1) forming a second 3-color pixel sensor, 90*r* (R2), 90*g* (G2), and 90*b* (B2) forming a third 3-color pixel sensor, 92*r* (R3), 92*g* (G3), 92*b* (B3) forming a fourth 3-color pixel sensor, and 94*r* (R2), 94*g* (G2), and 94*b* (B2) forming a fifth 3-color pixel sensor.

Row 82 has three transfer gate lines TG0, TG1, and TG2. The three transfer gate lines for row 82 are identified, respectively, by reference numerals 106, 108, and 110, respectively.

Each column in the array has a column output line. The column output line for column C0 is identified by reference numeral 118. The column output line for column C1 is identified by reference numeral 120. The column output line for column C2 is identified by reference numeral 122. The column output line for column C3 is identified by reference numeral 124.

Each individual color pixel sensor is connected to a column output line of the column with which it is associated through a transfer transistor. As in the embodiment shown in FIG. 3, each transfer transistor in the embodiment depicted in FIG. 7 will be identified by a reference numeral that identifies its pixel followed by a suffix "t" and color identifier "r" for red, "g" for green, or "b" for blue. As an example, the transfer transistor for the red pixel sensor in pixel sensor 86 is identified as 86*tr*. Each of the transfer transistors has its gate connected to one of the transfer gate lines 106, 108, and 110 for pixel readout in accordance with the architectures disclosed herein.

Red pixel 86*r* is coupled to column output line C0 118 by transfer transistor 86*tr* having its gate connected to row line TG0 106. Green pixel 86*g* is coupled to column output line C0 118 by transfer transistor 86*tg* having its gate connected to row line TG1 108. Blue pixel 86*b* is coupled to column output line C0 118 by transfer transistor 86*tb* having its gate connected to row line TG2 110.

Red pixel 88*r* is coupled to column output line C1 120 by transfer transistor 88*tr* having its gate connected to row line TG1 108. Green pixel 88*g* is coupled to column output line C1 120 by transfer transistor 88*tg* having its gate connected to row line TG2 110. Blue pixel 88*b* is coupled to column output line C1 120 by transfer transistor 88*tb* having its gate connected to row line TG0 106.

Red pixel 90*r* is coupled to column output line C2 122 by transfer transistor 90*tr* having its gate connected to row line TG2 110. Green pixel 90*g* is coupled to column output line C2 122 by transfer transistor 90*tg* having its gate connected to row line TG0 106. Blue pixel 90*b* is coupled to column output line C2 122 by transfer transistor 90*tb* having its gate connected to row line TG1 108.

Red pixel 92*r* is coupled to column output line C3 124 by transfer transistor 92*tr* having its gate connected to row line TG0 106. Green pixel 92*g* is coupled to column output line C3 124 by transfer transistor 92*tg* having its gate connected to row line TG1 108. Blue pixel 92*b* is coupled to column output line C3 124 by transfer transistor 92*tb* having its gate connected to row line TG2 110.

Red pixel 94*r* is coupled to column output line C4 126 by transfer transistor 94*tr* having its gate connected to row line TG0 106. Green pixel 94*g* is coupled to column output line C4 126 by transfer transistor 94*tg* having its gate connected to row line TG1 108. Blue pixel 94*b* is coupled to column output line C4 126 by transfer transistor 94*tb* having its gate connected to row line TG2 110.

The pattern of connections from the color pixel sensors to the transfer gate lines shown in FIGS. 7 and 8 repeats in four-pixel groups in four adjacent columns across a row of the array. Persons of ordinary skill in the art will appreciate that the red, green and blue pixel sensors 94*r*, 94*g*, and 94*b* form the first column of the next repeating four-pixel group. Persons of ordinary skill in the art will also appreciate that, while a single row and five columns are shown in FIG. 7 to illustrate this aspect of the present invention, imaging arrays configured in accordance with this aspect of the invention can have an arbitrary number of rows and columns.

As shown in the table of FIG. 8, in the case of a particular embodiment illustrated in FIG. 7 where the first color is red, the second color is green, and the third color is blue, the colors are read out across the columns (extended to eight columns) in order as follows:

| Column Position | 0 | 1 | 2 | 3 | 4 | 5 | 6 | 7 |
|---|---|---|---|---|---|---|---|---|
| Row i TG0 | R | B | G | R | R | B | G | R |
| Row i TG1 | G | R | B | G | G | R | B | G |
| Row i TG2 | B | G | R | B | B | G | R | B |
| Row (i + 1) TG0 | R | B | G | R | R | B | G | R |
| Row (i + 1) TG1 | G | R | B | G | G | R | B | G |
| Row (i + 1) TG2 | B | G | R | B | B | G | R | B |

If the readout time per row is t, then the total readout time for a stillshot for all three colors of each of the pixels in row i (82) is 6t. This is exactly the same performance obtained by wiring the row transfer gate lines in accordance with prior-art practice.

To perform a video readout of this arrangement (which is neither an X3 type readout or a mosaic readout), the colors are read in the columns as follows (extended to show eight columns):

| Column Position | 0 | 1 | 2 | 3 | 4 | 5 | 6 | 7 |
|---|---|---|---|---|---|---|---|---|
| Row i TG0 | — | B | G | — | — | B | G | — |
| Row i TG1 | G | R | — | — | G | R | — | — |
| Row (i + 8) TG0 | — | B | G | — | — | B | G | — |
| Row (i + 8) TG1 | G | R | — | — | G | R | — | — |

This readout process takes 4t, the same as a video mosaic readout from an array having mosaic wiring. The video image from this array has better color aliasing because the pixels of different colors are closer together than they are in a mosaic array, but not as good as a normal X3 type readout.

Persons of ordinary skill in the art will readily understand that permuting the colors (i.e., providing one color in each position but changing the order of the red, green, and blue) is considered to be within the scope of the present invention.

Figures 9, 10:
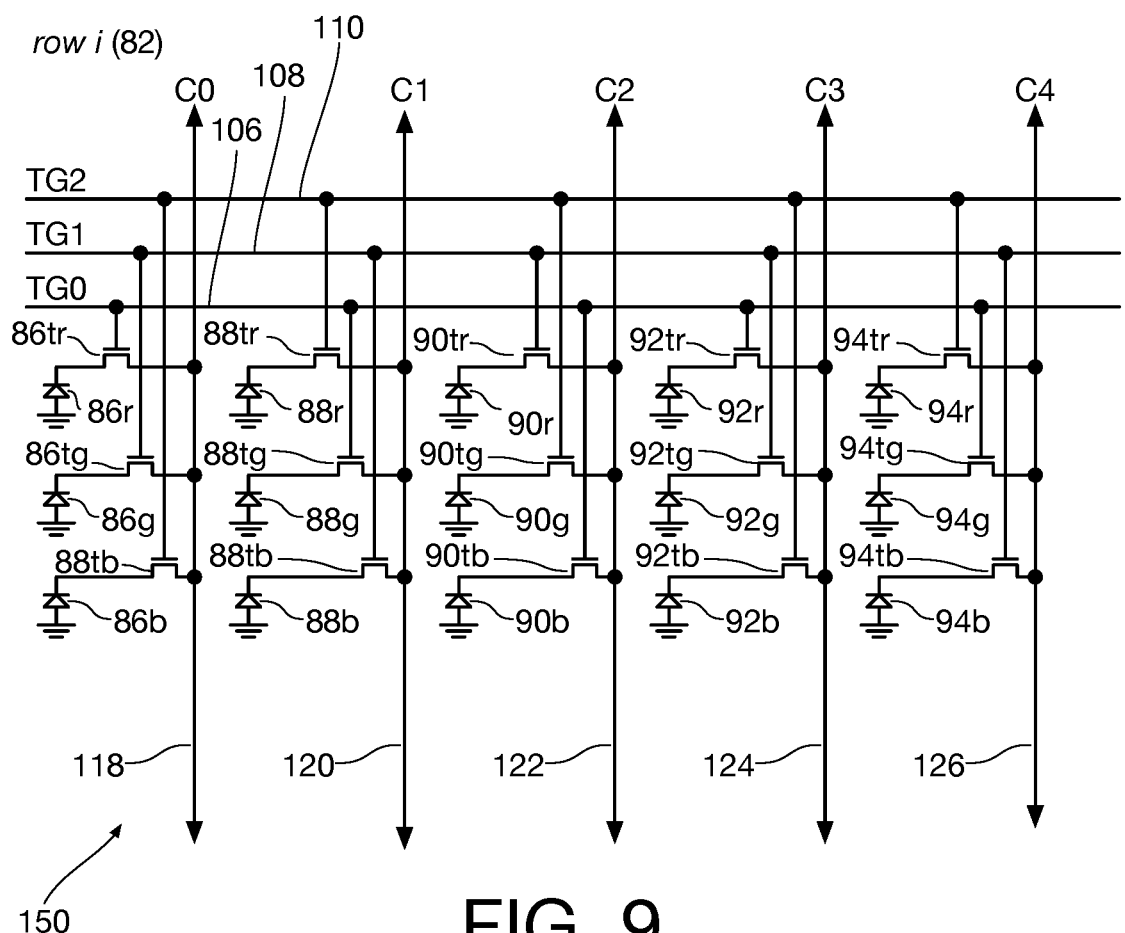
FIG. 9 is a simplified schematic diagram showing a portion of an array of pixel sensors such as the one depicted in FIG. 2A with an illustrative row and column wiring architecture for operating the array in accordance with another aspect of the present invention.
FIG. 10 is a table showing the outputs on the column lines of the array depicted in FIG. 9.

Referring now to FIG. 9, a wiring architecture is depicted for row i 82 of 3-color vertical pixel sensors in a pixel sensor array 150 in accordance with another aspect of the present invention. As in the embodiment depicted in FIG. 3, each 3-color pixel sensor in the embodiment depicted in FIG. 9 includes a red pixel sensor, a green pixel sensor, and a blue pixel sensor for individual red, green, and blue color sensing at the same location in the imaging array. Where elements of the imaging array depicted in FIG. 9 correspond to elements depicted in the imaging array of FIG. 3, they will be identified using the same reference numerals used in FIG. 3.

As may be seen from an examination of FIG. 9, the row i (82) includes three columns of 3-color pixel sensors, 86r (R0), 86g (G0), and 86b (B0) forming a first 3-color pixel sensor, 88r (R1), 88g (G1), and 88b (B1) forming a second 3-color pixel sensor, and 90r (R2), 90g (G2), and 90b (B2) forming a third 3-color pixel sensor.

Row 82 has three transfer gate lines TG0, TG1, and TG2. The three transfer gate lines for row 82 are identified, respectively, by reference numerals 106, 108, and 110, respectively.

Each column in the array has a column output line. The column output line for column C0 is identified by reference numeral 118. The column output line for column C1 is identified by reference numeral 120. The column output line for column C2 is identified by reference numeral 122.

Each individual color pixel sensor is connected to a column output line of the column with which it is associated through a transfer transistor. As in the embodiment shown in FIG. 3, each transfer transistor in the embodiment depicted in FIG. 9 will be identified by a reference numeral that identifies its pixel followed by a suffix "t" and color identifier "r" for red, "g" for green, or "b" for blue. As an example, the transfer transistor for the red pixel sensor in pixel sensor 86 is identified as 86tr. Each of the transfer transistors has its gate connected to one of the transfer gate lines 106, 108, and 110 for pixel readout in accordance with the architectures disclosed herein.

Red pixel 86r is coupled to column output line C0 118 by transfer transistor 86tr having its gate connected to row line TG0 106. Green pixel 86g is coupled to column output line C0 118 by transfer transistor 86tg having its gate connected to row line TG1 108. Blue pixel 86b is coupled to column output line C0 118 by transfer transistor 86tb having its gate connected to row line TG2 110.

Red pixel 88r is coupled to column output line C1 120 by transfer transistor 88tr having its gate connected to row line TG2 110. Green pixel 88g is coupled to column output line C1 120 by transfer transistor 88tg having its gate connected to row line TG0 106. Blue pixel 88b is coupled to column output line C1 120 by transfer transistor 88tb having its gate connected to row line TG1 108.

Red pixel 90r is coupled to column output line C2 122 by transfer transistor 90tr having its gate connected to row line TG1 108. Green pixel 90g is coupled to column output line C2 122 by transfer transistor 90tg having its gate connected to row line TG2 110. Blue pixel 90b is coupled to column output line C2 122 by transfer transistor 90tb having its gate connected to row line TG0 106.

As will be appreciated by persons of ordinary skill in the art, the pattern of connections from the color pixel sensors to the transfer gate lines shown in FIGS. 9 and 10 repeats in three-column groups. Persons of ordinary skill in the art will appreciate that, while a single row and three columns are shown in FIG. 9 to illustrate this aspect of the present invention, imaging arrays configured in accordance with this aspect of the invention can have an arbitrary number of rows and columns.

As shown in the table of FIG. 10, in the case of a particular embodiment illustrated in FIG. 9 where the first color is red, the second color is green, and the third color is blue, the colors are read out across the columns (extended to six columns) in order as follows:

| C | 0 | 1 | 2 | 3 | 4 | 5 |
|---|---|---|---|---|---|---|
| Row i TG0 | R | G | B | R | G | B |
| Row i TG1 | G | B | R | G | B | R |
| Row i TG2 | B | R | G | B | R | G |
| Row (i + 1) TG0 | R | G | B | R | G | B |
| Row (i + 1) TG1 | G | B | R | G | B | R |
| Row (i + 1) TG2 | B | R | G | B | R | G |

If the readout time per row is t, then the total readout time for all three colors of each of the pixels in row i (82) is 6t. This is exactly the same performance obtained by wiring the row transfer gate lines in accordance with prior-art practice.

To perform a video readout of this arrangement (which is neither an X3 type readout or a mosaic readout), the colors are read in the columns as follows (extended to show six columns):

| Column Position | 0 | 1 | 2 | 3 | 4 | 5 |
|---|---|---|---|---|---|---|
| Row i TG0 | R | G | B | R | G | B |
| Row (i + 8) TG0 | R | G | B | R | G | B |

The readout speed is 2t for two rows which is twice the speed of the mosaic readout using mosaic wiring.

Persons of ordinary skill in the art will readily understand that permuting the colors (i.e., providing one color in each position but changing the order of the red, green, and blue) is considered to be within the scope of the present invention.

Figures 11, 12:
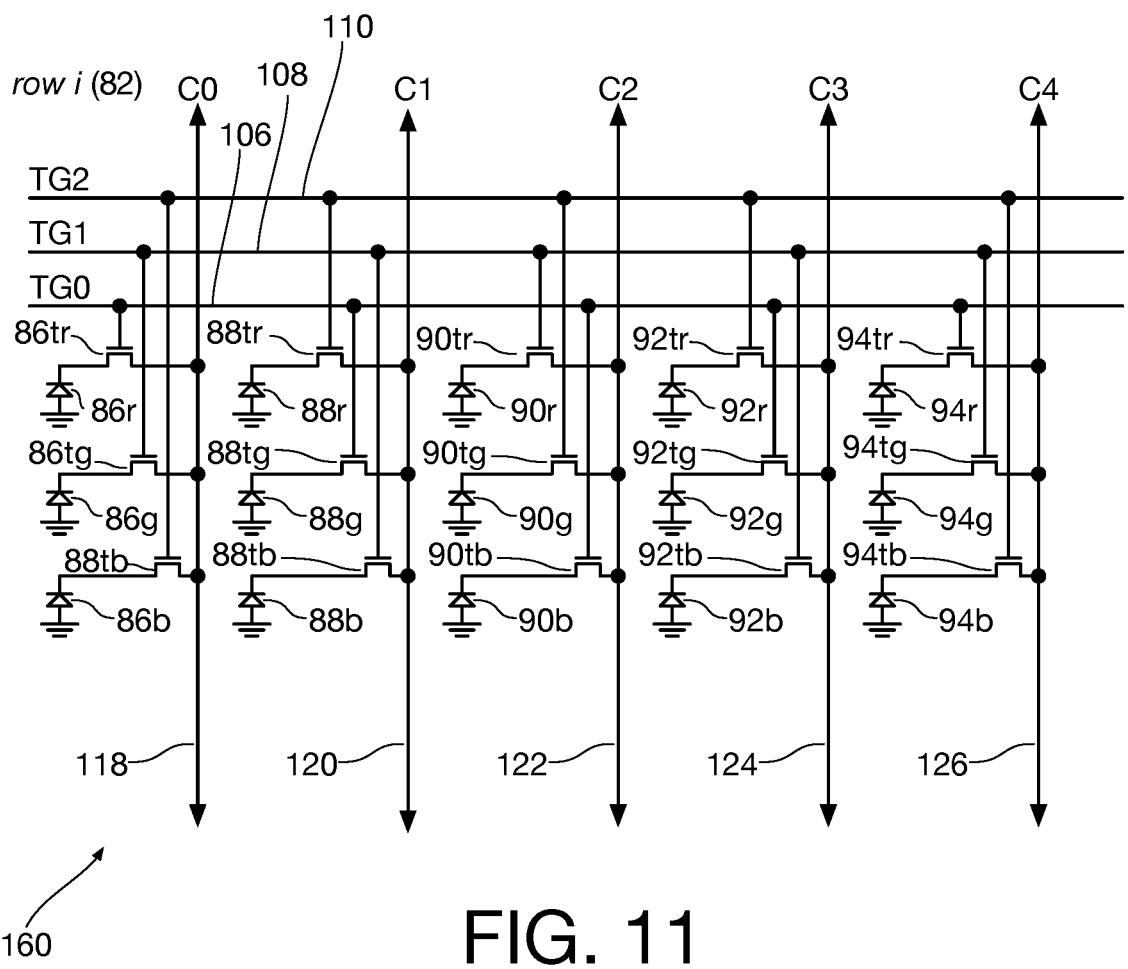
FIG. 11 is a simplified schematic diagram showing a portion of an array of pixel sensors such as the one depicted in FIG. 2A with an illustrative row and column wiring architecture for operating the array in accordance with another aspect of the present invention.
FIG. 12 is a table showing the outputs on the column lines of the array depicted in FIG. 11.

Referring now to FIG. 11, a wiring architecture is depicted for row i 82 of 3-color vertical pixel sensors in a pixel sensor array 160 in accordance with another aspect of the present invention. As in the embodiment depicted in FIG. 3, each 3-color pixel sensor in the embodiment depicted in FIG. 11 includes a red pixel sensor, a green pixel sensor, and a blue pixel sensor for individual red, green, and blue color sensing at the same location in the imaging array. Where elements of the imaging array depicted in FIG. 11 correspond to elements depicted in the imaging array of FIG. 3, they will be identified using the same reference numerals used in FIG. 3.

As may be seen from an examination of FIG. 11, the row i (82) includes four columns of 3-color pixel sensors, 86*r* (R0), 86*g* (G0), and 86*b* (B0) forming a first 3-color pixel sensor, 88*r* (R1), 88*g* (G1), and 88*b* (B1) forming a second 3-color pixel sensor, 90*r* (R2), 90*g* (G2), and 90*b* (B2) forming a third 3-color pixel sensor, and 92*r* (R3), 92*g* (G3), 92*b* (B3) forming a fourth 3-color pixel sensor.

Row 82 has three transfer gate lines TG0, TG1, and TG2. The three transfer gate lines for row 82 are identified, respectively, by reference numerals 106, 108, and 110, respectively.

Each column in the array has a column output line. The column output line for column C0 is identified by reference numeral 118. The column output line for column C1 is identified by reference numeral 120. The column output line for column C2 is identified by reference numeral 122. The column output line for column C3 is identified by reference numeral 124.

Each individual color pixel sensor is connected to a column output line of the column with which it is associated through a transfer transistor. As in the embodiment shown in FIG. 3, each transfer transistor in the embodiment depicted in FIG. 11 will be identified by a reference numeral that identifies its pixel followed by a suffix "t" and color identifier "r" for red, "g" for green, or "b" for blue. As an example, the transfer transistor for the red pixel sensor in pixel sensor 86 is identified as 86*tr*. Each of the transfer transistors has its gate connected to one of the transfer gate lines 106, 108, and 110 for pixel readout in accordance with the architectures disclosed herein.

Red pixel 86*r* is coupled to column output line C0 118 by transfer transistor 86*tr* having its gate connected to row line TG0 106. Green pixel 86*g* is coupled to column output line C0 118 by transfer transistor 86*tg* having its gate connected to row line TG1 108. Blue pixel 86*b* is coupled to column output line C0 118 by transfer transistor 86*tb* having its gate connected to row line TG2 110.

Red pixel 88*r* is coupled to column output line C1 120 by transfer transistor 88*tr* having its gate connected to row line TG2 110. Green pixel 88*g* is coupled to column output line C1 120 by transfer transistor 88*tg* having its gate connected to row line TG0 106. Blue pixel 88*b* is coupled to column output line C1 120 by transfer transistor 88*tb* having its gate connected to row line TG1 108.

Red pixel 90*r* is coupled to column output line C2 122 by transfer transistor 90*tr* having its gate connected to row line TG1 108. Green pixel 90*g* is coupled to column output line C2 122 by transfer transistor 90*tg* having its gate connected to row line TG2 110. Blue pixel 90*b* is coupled to column output line C2 122 by transfer transistor 90*tb* having its gate connected to row line TG0 106.

Red pixel 92*r* is coupled to column output line C3 124 by transfer transistor 92*tr* having its gate connected to row line TG2 110. Green pixel 92*g* is coupled to column output line C3 124 by transfer transistor 92*tg* having its gate connected to row line TG0 106. Blue pixel 92*b* is coupled to column output line C3 124 by transfer transistor 92*tb* having its gate connected to row line TG1 108.

Red pixel 94*r* is coupled to column output line C4 126 by transfer transistor 94*tr* having its gate connected to row line TG0 106. Green pixel 94*g* is coupled to column output line C4 126 by transfer transistor 94*tg* having its gate connected to row line TG1 108. Blue pixel 94*b* is coupled to column output line C4 126 by transfer transistor 94*tb* having its gate connected to row line TG2 110.

As will be appreciated by persons of ordinary skill in the art, the pattern of connections from the color pixel sensors to the transfer gate lines shown in FIGS. 11 and 12 repeats in four-column groups. Persons of ordinary skill in the art will appreciate that, while a single row and four columns are shown in FIG. 11 to illustrate this aspect of the present invention, imaging arrays configured in accordance with this aspect of the invention can have an arbitrary number of rows and columns.

As shown in the table of FIG. 12, in the case of a particular embodiment illustrated in FIG. 11 where the first color is red, the second color is green, and the third color is blue, the colors are read out in the columns as follows (extended to show eight columns):

| Column Position | 0 | 1 | 2 | 3 | 4 | 5 | 6 | 7 |
|---|---|---|---|---|---|---|---|---|
| Row i TG0 | R | G | B | G | R | G | B | G |
| Row i TG1 | G | B | R | B | G | B | R | B |
| Row i TG2 | B | R | G | R | B | R | G | R |
| Row (i + 1) TG0 | R | G | B | G | R | G | B | G |
| Row (i + 1) TG1 | G | B | R | B | G | B | R | B |
| Row (i + 1) TG2 | B | R | G | R | B | R | G | R |

If the readout time per row is t, then the total readout time for all three colors of each of the pixels in row i (82) is 6t. This is exactly the same performance obtained by wiring the row transfer gate lines in accordance with prior-art practice.

To perform a video readout of this arrangement (which is neither an X3 type readout or a mosaic readout), the colors are read in the columns as follows (extended to show eight columns):

| Column Position | 0 | 1 | 2 | 3 | 4 | 5 | 6 | 7 |
|---|---|---|---|---|---|---|---|---|
| Row i TG0 | R | G | B | G | R | G | B | G |
| Row (i + 8) TG0 | R | G | B | G | R | G | B | G |

This takes 2t for 2 rows, twice the speed of a mosaic readout with mosaic wiring.

Persons of ordinary skill in the art will note that the "R G B" and the "B G. R" groups are combined into one pixel at the "G" positions. This gives it more calculated pixels (one every 2 horizontal pixels) than the embodiment of FIG. 9.

The embodiment depicted in FIGS. 11 and 12 has some color aliasing, similar to mosaic wiring. This embodiment has a repeating pattern of four as opposed to mosaic wiring which has a repeating pattern of two.

Figure 2B:
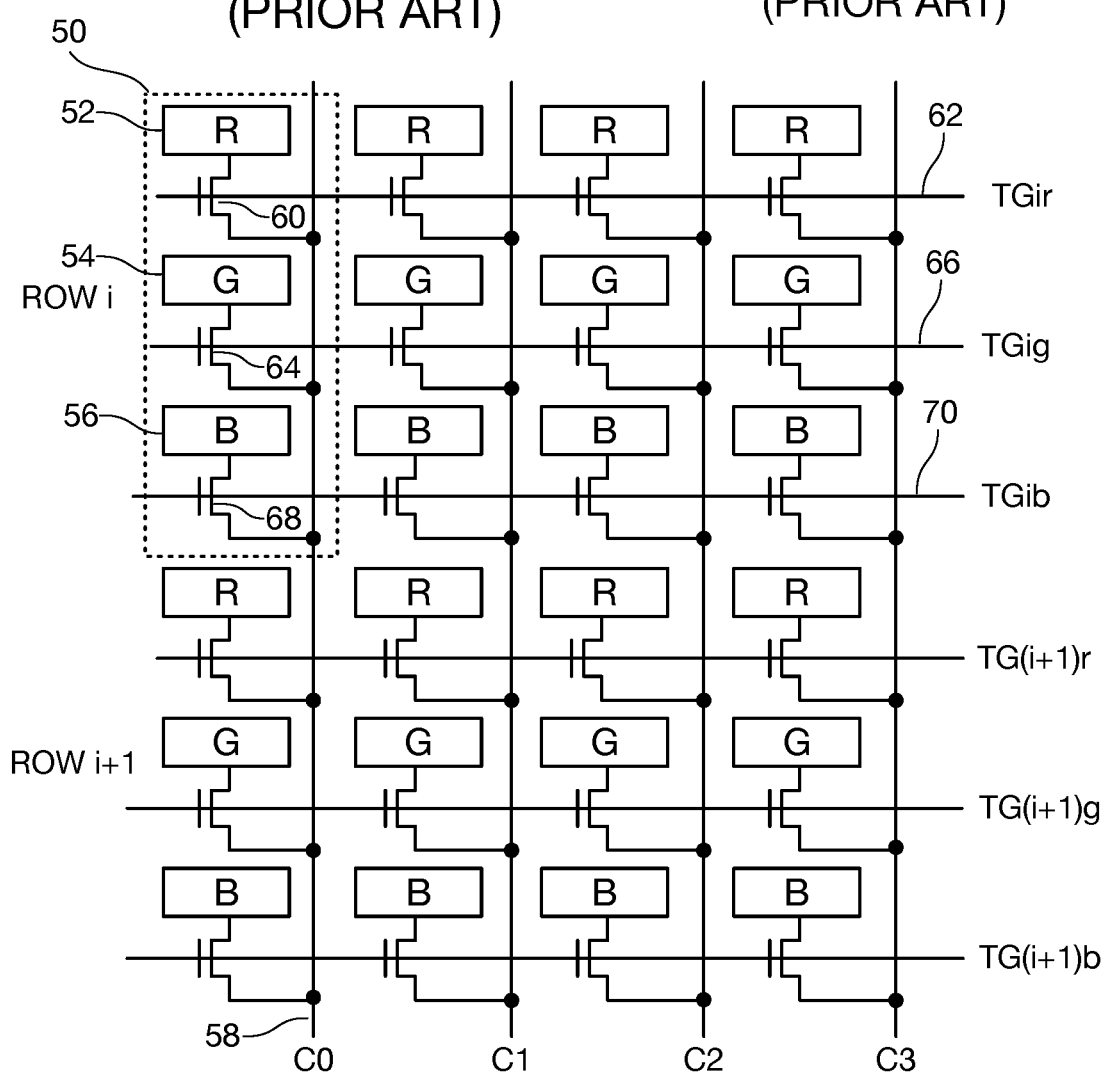
FIG. 2B is a simplified schematic diagram of a portion of an array of pixel sensors such as the one depicted in FIG. 2A with an illustrative prior-art row and column wiring architecture for operating the array.

According to another embodiment of the present invention, the conventionally-wired array shown in FIG. 2B may be read out in a video mode. The following table shows the readout of the all colors and pixels for FIG. 2B.

| Column Position | 0 | 1 | 2 | 3 |
|---|---|---|---|---|
| Row i TG0 | R | R | R | R |
| Row i TG1 | G | G | G | G |
| Row i TG2 | B | B | B | B |
| Row (i + 1) TG0 | R | R | R | R |
| Row (i + 1) TG1 | G | G | G | G |
| Row (i + 1) TG2 | B | B | B | B |

This readout architecture uses the wiring of FIG. 2B but gives the same speed as mosaic readout using the embodiment of FIG. 4 at the cost of additional aliasing.

To perform a video readout of this arrangement (which is neither an X3 type readout or a mosaic readout), the colors are read in the columns as follows:

| Column Position | 0 | 1 | 2 | 3 |
|---|---|---|---|---|
| Row i TG0 | R | R | R | R |
| Row i TG1 | G | G | G | G |
| Row (i + 8) TG1 | G | G | G | G |
| Row (i + 8) TG2 | B | B | B | B |

Figure 13:
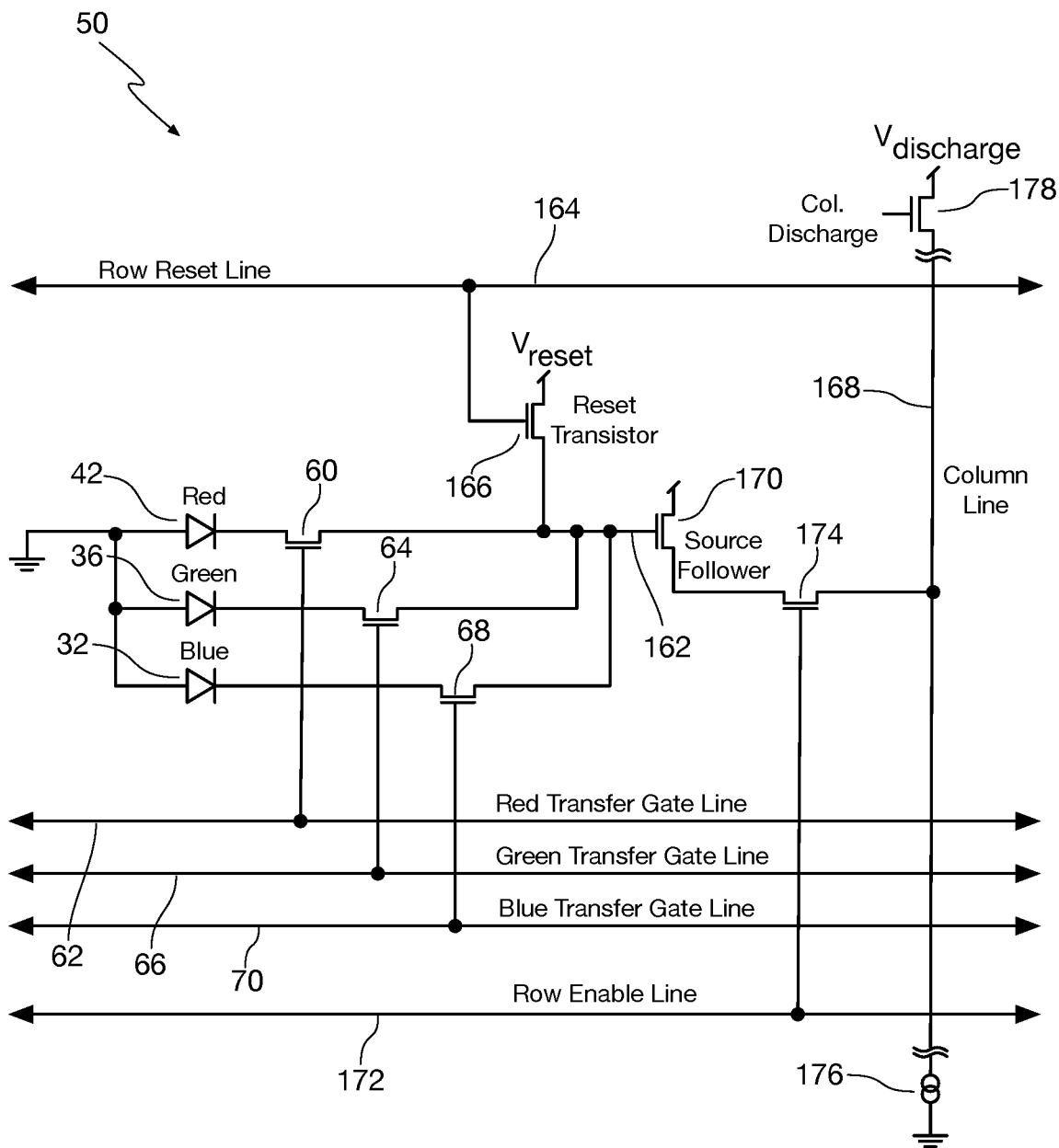
FIG. 13 is a schematic diagram depicting a typical environment in which a multicolor vertical pixel sensor can be deployed.

In all of the embodiments depicted in FIGS. 3, 5, 7, 9, and 11, persons of ordinary skill in the art will immediately recognize that the schematic diagrams have been simplified to avoid overcomplicating the drawing figures and possibly obscuring the invention. An individual multicolor vertical pixel sensor 30 of FIG. 2A will be connected to a row line and a column line in an array of pixel sensors. FIG. 13 is provided to show a non-limiting example of an environment in which an individual multicolor vertical pixel sensor 30 of FIG. 2A will be employed.

The elements of FIG. 13 will be depicted in the context of the prior-art array of FIG. 2B with respect to the row and column wiring in order to present an example of the pixel 30 and its connections to the array in more detail. Where appropriate, the reference numerals utilized in FIG. 2B will be employed to designate elements of FIG. 13 that are present in those prior drawing figures.

In the prior-art configuration shown in FIG. 2B, the red sensor in row i of the array is indicated as a diode at reference numeral 52, the green sensor is indicated as a diode at reference numeral 54, and the blue sensor is indicated as a diode by reference numeral 56. The red transfer transistor is indicated at reference numeral 60, and its gate is coupled to the transfer gate line TGir 62. The green transfer transistor is indicated at reference numeral 64, and its gate is coupled to the transfer gate line TGig 66. The blue transfer transistor is indicated at reference numeral 68, and its gate is coupled to the transfer gate line TGib 70. The transfer gate lines are conventionally wired in that all of the red sensors in row i are coupled to the red transfer gate line 62, all of the green sensors in row i are coupled to the green transfer gate line 66, and all of the blue sensors in row i are coupled to the blue transfer gate line 70.

In a non-limiting example of an actual sensor shown in FIG. 13, the red green and blue transfer transistors 60, 64, and 68 are connected together to a common node 162. The common node 162 may be coupled to a reset potential $V_{reset}$ through pixel reset transistor 166 having its gate coupled to a row reset line 164. The common node 162 is also coupleable to a column output line 168 of the array through a device such as a source-follower amplifier transistor 170 having its gate coupled to the common node. A row enable line 172 turns on transistor 174 to couple the output of the source-follower transistor 170 when it is desired to read out the charge accumulated by the photodiodes 32, 36, and 42. As will be appreciated by persons of ordinary skill in the art, the column line 168 may be driven by a current source 176 as is known in the art. The column line 168 may also be discharged to a column discharge potential $V_{discharge}$ at selected times by applying a column discharge signal to the gate of column discharge source-follower transistor 178.

Persons of ordinary skill in the art will appreciate that the principles of the present invention are easily applied to an array of multicolor vertical pixel sensors such as, but not limited to, the one shown in the example of FIG. 13 by re-arranging the red, green, and blue select lines 62, 66, and 70, substituting the transfer gate lines TG0 106, TG1 108, and TG2 110 as disclosed with the several embodiments of the present invention presented herein.

Referring now to FIG. 14, a top view of a simplified portion of a layout of four vertical pixel sensors like pixel sensor 30 of FIG. 2A in a row of an array of such pixel sensors shown in FIG. 3 and shows the positioning of the plugs used to transfer the charge from the buried red and green sensors as well as the contact for the blue sensor. Where elements of the pixel sensor of FIG. 2A are depicted in FIG. 14 they will be referred to using the same reference numerals used to designate these elements in FIG. 2A. Because four pixels are shown in FIG. 14, they will be identified by reference numerals including suffixes "a" through "d" respectively. Persons of ordinary skill in the art will appreciate that, while the top view of FIG. 14 is drawn showing the buried red and green sensors in pixel sensors 30a, 30b, 30c, and 30d being slightly offset from one another, this is done for the purpose of illustrating the invention and that in an actual embodiment of a vertical pixel sensor the blue, green and red color sensors will be in alignment with one another.

In pixel sensor 30a of FIG. 14, reference numeral 40a indicates a tab extending outward from the red sensor 42a to which the plug that carries the charge from the red sensor (shown in dashed lines designated by reference numeral 42a) makes contact. Reference numeral 46a indicates a tab extending outward from the green sensor 36a which contacts the plug that carries the charge from the green sensor (shown in dashed lines designated by reference numeral 36a) Similarly, in pixel sensors 30b through 30d, reference numerals 40b through 40d respectively indicate the tabs extending from the red sensors that indicate the locations of the plugs that carry the charge from the red sensors (shown in dashed lines designated by reference numerals 42b through 42d) and reference numerals 46b through 46d respectively indicate the tabs that correspond to the locations of the plugs that carry the charge from the green sensors (shown in dashed lines designated by reference numeral 36b through 36d). As will be appreciated by persons of ordinary skill in the art the tabs 40a through 40d, and 46a through 46d are located outside of the edge of the light collecting areas of their respective sensors in order to fully utilize the light collecting area of each of the sensors.

The blue sensors 32a through 36d are shown in solid lines since they are at the surface of the pixel sensors and do not require plugs but instead have tabs designated 186a through 186d for contacting the blue sensors 32a through 36d.

In pixel sensor 30a reference numerals 182a, 184a, and 188a each designate the connecting structures, respectively, from the red, green and blue sensors. As will be appreciated by persons of ordinary skill in the art, plugs (40 and 46, respectively shown in FIG. 2A for the green and red sensors) are needed to carry the outputs of the buried green and red sensors to the semiconductor surface. Each of the connecting structures are more complex connecting structures than the simple contacts 34, 38, and 44 that indicate the connections to the blue, green, and red sensors 32, 36, and 42, respectively in FIG. 2A, in that these structures will make connections to the transfer transistors, and the reset transistors and the gates of the amplifier transistors that are coupled to the transfer transistors for the blue, green, and red sensors 32a, 36a and 42a. None of these elements are explicitly shown in FIG. 14 in order to avoid overcomplicating the drawing figure but, as shown in FIG. 13, the presence and arrangement of these components in such an array are well known to those of ordinary skill in the art. In like fashion, in pixel sensors 30b through 30d, reference numerals 182b-d, 184b-d and 188b-d each designate a connecting structure like that described for pixel sensor 30a.

In one layout for a multi-color vertical pixel sensor array such as the one depicted in FIG. 14, locations of the tabs extending from the red and green sensors that make connections to the contact plugs used to make connections to the surface red and green connecting structures and the tab extending from the surface blue sensor used to make connections to the blue connecting structures in all of pixel sensors 30a through 30d are the same for every pixel. Thus, to implement the embodiment of the invention depicted in FIG. 3, transfer gate line TG0 (reference numeral 106 in all of FIGS. 3, 5, 7, 9, and 11) would be connected using a first routing (wiring segments 190 and 202) from the connecting structures 182a and 182c for the red sensors 42a, 42c in pixel sensors 30a and 30c, and using a second different routing (wiring segments 198 and 208) from the connecting structures 184b and 184d for the green sensors 36b, 36d, in pixel sensors 30b and 30d, thus complicating the metallization structure of the integrated circuit. The same is true for transfer gate line TG1 (reference numeral 108 in all of FIGS. 3, 5, 7, 9, and 11) in that it would be connected using a first routing (wiring segments 192 and 204) from the connecting structures 184a and 184c for the green sensors 36a, 36c in pixel sensors 30a and 30c, and using a second different routing (wiring segments 196 and 210) from the connecting structures 182b and 182d for the red sensors 42b, 42d, in pixel sensors 30b and 30d. Note that simple wiring segments 190 and 192 are used to connect transfer gate lines TG0 and TG1, respectively, to the red and green connecting structures 182a and 184a in pixel sensor 30a, and simple wiring segments 202 and 204 are used to connect transfer gate lines TG0 and TG1, respectively, to the red and green connecting structures 182c and 184c in pixel sensor 30c. Simple wiring segments 194, 200, 206, and 212 are used to connect transfer gate line TG2 to the blue connecting structures 188a, 188b, 188c, and 188d. Persons skilled in the art will note that transfer gate lines TG0 and TG1 are located in one metal interconnect layer and transfer gate line TG2 is located in a second different metal interconnect layer.

More complicated and longer routing is needed to connect transfer gate lines TG0 106 and TG1 108, respectively, through plugs to the red and green connecting structures 182b and 184b in pixel sensor 30b by requiring a longer metal line segment 196 extending from transfer gate line TG1 (reference numeral 108) to the connecting structure 182b and a similar longer metal line segment 198 extending from transfer gate line TG0 (reference numeral 106) to the connecting structure 184b. The same is true for connecting the red and green connecting structures 182d and 184d in pixel sensor 30d by requiring a longer metal line segment 210 extending from transfer gate line TG1 (reference numeral 108) to the connecting structure 182d and a similar longer metal line segment 208 extending from transfer gate line TG0 (reference numeral 106) to the connecting structure 184d.

In accordance with an embodiment of the invention, a modified pixel layout simplifies the wiring to the pixel sensors. Referring now to FIG. 15, a top view shows a simplified portion of a layout of four vertical pixel sensors 30a through 30d in a row of an array to illustrate another aspect of the invention whereby the positioning of the tabs that connect to the plugs used to transfer the charge from the buried red and green sensors is different in alternate adjacent pixel sensors in accordance with an aspect of the present invention. The layout depicted in FIG. 15 in accordance with this aspect of the present invention corresponds to the embodiment of the invention depicted in FIG. 3. As was the case in FIG. 14, persons skilled in the art will note that transfer gate lines TG0 and TG1 106 and 108 are located in one metal interconnect layer and transfer gate line TG2 110 is located in a second different metal interconnect layer.

Persons of ordinary skill in the art will observe that the arrangement of pixel sensors 30a through 30d in FIG. 15 is similar to that of pixels sensors 30a through 30d of FIG. 14, except that the physical positions of tabs 40b and 46b and 40d and 46d in pixel sensors 30b and 30d are reversed from the positions of corresponding tabs 40a and 46a and 40c and 46c in pixel sensors 30a and 30c. As may be seen from FIG. 15, this layout change simplifies the metallization structure of the integrated circuit allowing simpler and shorter metal line segments 214 and 216 to extend from transfer gate TG0 (reference numeral 106) to the green metal interconnect structures 184b and 184d and shorter metal line segments 218 and 220 to extend from transfer gate line TG1 (reference numeral 108), respectively, to connect to the red metal interconnect structures 182b and 182d in pixel sensors 30b and 30d. Thus, the metal line segments 214 and 218 in pixel sensor 30b and the metal line segments 216 and 220 in pixel sensor 30d may be geometrically the same as the metal line segments 190 and 192 in pixel sensor 30a and the metal line segments 202 and 204 in pixel sensor 30c. The connections to the blue contacts in the pixel sensors 30a through 30d are the same as those shown in FIG. 14.

Referring now to FIG. 16, a top view shows a simplified portion of a layout of four adjacent vertical pixel sensors 30a, 30b, 30c, and 30d in a row of an array to illustrate another aspect of the invention whereby the positioning of the plugs used to transfer the charge from the buried red and green sensors is different in a group of four adjacent pixel sensors in accordance with an aspect of the present invention. Persons of ordinary skill in the art will observe that the arrangement of pixel sensors 30a through 30d in FIG. 16 is also similar to that of pixels sensors 30a through 30d of FIG. 14, except that the physical positions of red and green tabs 40b and 46b and red and green tabs 40c and 46c in pixel sensors 30b and 30c are reversed from the positions of corresponding red and green tabs 40a and 46a and red and green tabs 40d and 46d in pixel sensors 30a and 30d. The layout depicted in FIG. 16 in accordance with this aspect of the present invention corresponds to the embodiment of the invention depicted in FIG. 7. The pattern of connections to the transfer gate lines TG0, TG1, and TG2 is different for adjacent pixels 30a, 30b and 30c. The transfer gate connections for pixel 30a is the same as in FIG. 14 and FIG. 15. In pixel 30b, transfer gate TG0 106 is connected to blue metal interconnect structure 188b by metal segment 222, transfer gate TG1 108 is connected to red interconnect structure 182b by metal segment 224, and transfer gate TG2 110 is connected to green interconnect structure 184b by metal segment 226. In pixel 30c, transfer gate TG0 106 is connected to green metal interconnect structure 184c by metal segment 228, transfer gate TG1 108 is connected to blue interconnect structure 188c by metal segment 230, and transfer gate TG2 110 is connected to red interconnect structure 182c by metal segment 232. The layout of the fourth pixel sensor 30d is the same as that of the first pixel sensor 30a. In pixel 30d, transfer gate TG0 106 is connected to red metal interconnect structure 182d by metal segment 234, transfer gate TG1 108 is connected to green interconnect structure 184d by metal segment 2236, and transfer gate TG2 110 is connected to blue interconnect structure 188d by metal segment 238. The pattern repeats every four columns of pixels, the fifth pixel sensor in the fifth column (C4) shown in FIG. 7 containing red pixel 94r, green pixel 94g, and blue pixel 94b is the first pixel sensor in the next repeating group of four vertical pixel sensors. Transfer gate lines TG0 106 and TG1 108 are located in one metal interconnect layer and transfer gate line TG2 110 is located in a second different metal interconnect layer.

Referring now to FIG. 17, a top view shows a simplified portion of a layout of four adjacent vertical pixel sensors 30a, 30b, 30c, and 30d in a row of an array to illustrate another aspect of the invention whereby the positioning of the plugs used to transfer the charge from the buried red and green sensors is different in a group of four adjacent pixel sensors in accordance with an aspect of the present invention. The layout depicted in FIG. 17 in accordance with this aspect of the present invention corresponds to the embodiment of the invention depicted in FIG. 9. The pattern of connections to the transfer gate lines TG0, TG1, and TG2 is different for adjacent pixels 30a, 30b and 30c. The transfer gate connections for pixel 30a is the same as in FIG. 14, FIG. 15, and FIG. 16.

The transfer gate line TG0 106 is connected to the metal interconnect structure 182a of the red sensor 42a of pixel sensor 30a by wiring segment 190. The transfer gate line TG1 108 is connected to the metal interconnect structure 184a of the green sensor 36a of pixel sensor 30a by wiring segment 192. The transfer gate line TG2 110 is connected to the metal interconnect structure 188a of the blue sensor 32a of pixel sensor 30a by wiring segment 194. Both transfer gate line TG2 and wiring segment 194 are located on a different metallization layer than the other transfer gates and wiring segments.

In pixel sensor 30b, the positions of the red and green tabs 40b and 46b are reversed from the positions of the corresponding tabs in pixel sensor 30a. The transfer gate line TG0 106 is connected to the connecting structure 184b of the green sensor 36b of pixel sensor 30b by wiring segment 240. The transfer gate line TG1 108 is connected to the connecting structure 188b of the blue sensor 32b of pixel sensor 30b by wiring segment 242. The transfer gate line TG2 110 is connected to the connecting structure 182b of the red sensor 42b of pixel sensor 30b by wiring segment 244. Wiring segment 244 is located on the same metallization layer as transfer gate line TG2 110.

In pixel sensor 30c, the positions of the red and green tabs 40c and 46c are the same as the positions of the corresponding tabs in pixel sensor 30b. The transfer gate line TG0 106 is connected to the connecting structure 188c of the blue sensor 32c of pixel sensor 30c by wiring segment 246. The transfer gate line TG1 108 is connected to the connecting structure 182c of the red sensor 42c of pixel sensor 30c by wiring segment 248. The transfer gate line TG2 110 is connected to the connecting structure 184c of the green sensor 36c of pixel sensor 30c by wiring segment 250. Wiring segment 250 is located on the same metallization layer as transfer gate line TG2 110.

The pixel sensor 30d in FIG. 17 is connected to the transfer gate lines in the same manner as pixel sensor 30d of FIG. 16. The transfer gate line TG0 106 is connected to the metal interconnect structure 182d of the red sensor 42d of pixel sensor 30d by wiring segment 234. The transfer gate line TG1 108 is connected to the metal interconnect structure 184d of the green sensor 36d of pixel sensor 30d by wiring segment 236. The transfer gate line TG2 110 is connected to the blue connecting structure 188d of the blue sensor 32d of pixel sensor 30d by wiring segment 238.

Referring now to FIG. 18, a top view shows a simplified portion of a layout of four adjacent vertical pixel sensors 30a, 30b, 30c, and 30d like those of FIG. 2A in a row of an array to illustrate another aspect of the invention whereby the positioning of the plugs used to transfer the charge from the buried red and green sensors is different in a group of four adjacent pixel sensors in accordance with an aspect of the present invention. The layout depicted in FIG. 18 in accordance with this aspect of the present invention corresponds to the embodiment of the invention depicted in FIG. 11.

The pattern of connections to the transfer gate lines TG0, TG1, and TG2 is different for all of pixel sensors 30a through 30d. The pattern repeats every four columns of pixels, the fifth pixel sensor in the fifth column (C4) shown in FIG. 11 containing red pixel 94r, green pixel 94g, and blue pixel 94b is the first pixel sensor in the next repeating group of four vertical pixel sensors. Transfer gate lines TG0 106 and TG1 108 are located in one metal interconnect layer and transfer gate line TG2 110 is located in a second different metal interconnect layer in FIG. 18.

The transfer gate line TG0 106 is connected to the metal interconnect structure 182a of the red sensor 42a of pixel sensor 30a by wiring segment 190. The transfer gate line TG1 108 is connected to the metal interconnect structure 184a of the green sensor 36a of pixel sensor 30a by wiring segment 192. The transfer gate line TG2 110 is connected to the blue connecting structure 188a of the blue sensor 32a of pixel sensor 30a by wiring segment 194. The wiring segment 194 is located on the same wiring segment as transfer gate line TG2.

The transfer gate line TG0 106 is connected to the connecting structure 184b of the green sensor 36b of pixel sensor 30b by wiring segment 252. The transfer gate line TG1 108 is connected to the blue connecting structure 188b of the blue sensor 32b of pixel sensor 30b by wiring segment 254. The transfer gate line TG2 110 is connected to the red connecting structure 182b of the red sensor 42b of pixel sensor 30b by wiring segment 256. The wiring segment 256 is located on the same wiring segment as transfer gate line TG2.

The transfer gate line TG0 106 is connected to the blue connecting structure 188c of the blue sensor 32c of pixel sensor 30c by wiring segment 258. The transfer gate line TG1 108 is connected to the connecting structure 182c of the red sensor 42c of pixel sensor 30c by wiring segment 260. The transfer gate line TG2 110 is connected to the connecting structure 184c of the green sensor 36c of pixel sensor 30c by wiring segment 262. The wiring segment 262 is located on the same wiring segment as transfer gate line TG2.

The transfer gate line TG0 106 is connected to the connecting structure 184d of the green sensor 36d of pixel sensor 30d by wiring segment 264. The transfer gate line TG1 108 is connected to the blue connecting structure 188d of the blue sensor 32c of pixel sensor 30d by wiring segment 266. The transfer gate line TG2 110 is connected to the connecting structure 182d of the red sensor 42d of pixel sensor 30d by wiring segment 268. The wiring segment 268 is located on the same wiring segment as transfer gate line TG2.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an array including rows and columns of vertical detector color pixel sensors, each vertical detector color pixel sensor disposed in a row and column of the array and having individual color detectors for a number of colors, a readout wiring architecture comprising:
    a plurality of row-select lines for each row of the array, the number of row-select lines equal to the number of colors in the vertical detector color pixel sensors in the array;
    an individual column line for each column of the array;
    a transfer transistor for each individual color detector in each vertical detector color pixel sensor in the array, each transfer transistor coupled between a color detector disposed in a column of the array and a column line associated with the column of the array in which the color detector is disposed, each transfer transistor having a gate coupled to one of the plurality of row-select lines in a row of the array in which the vertical detector color pixel sensor is disposed;
    wherein the gates of at least some of the transfer transistors in each row of the array for each color detector in adjacent columns of the array are coupled to different ones of the row-select lines for that row of the array.

2. The readout wiring architecture of claim 1 wherein, for each row in the array, the coupling of gates of transfer transistors to row-select lines repeats in groups of three consecutive columns in which gates of transfer transistors in a first consecutive column of the array for each color are coupled to the row-select lines in a first order, gates of transfer transistors in a second consecutive column of the array for each color are coupled to the row-select lines in a second order different from the first order, and gates of transfer transistors in a third consecutive column of the array for each color are coupled to the row-select lines in a third order different from the first and second orders.

3. The readout wiring architecture of claim 2 wherein:
    in the first consecutive column, the gate of the transfer transistor for a first color detector is coupled to a first row-select line, the gate of the transfer transistor for a second color detector is coupled to a second row-select line, and the gate of the transfer transistor for a third color detector is coupled to a third row-select line;
    in the second consecutive column, the gate of the transfer transistor for the first color detector is coupled to the third row-select line, the gate of the transfer transistor for the second color detector is coupled to the first row-select line, and the gate of the transfer transistor for the third color detector is coupled to the second row-select line; and
    in the third consecutive column, the gate of the transfer transistor for the first color detector is coupled to the second row-select line, the gate of the transfer transistor for the second color detector is coupled to the third row-select line, and the gate of the transfer transistor for the third color detector is coupled to the first row-select line.

4. The readout wiring architecture of claim 1 wherein for each row in the array, the coupling of gates of transfer transistors to row-select lines repeats in groups of four consecutive columns in which gates of transfer transistors in a first consecutive column of the array for each color are coupled to the row-select lines in a first order, gates of transfer transistors in a second consecutive column of the array for each color are coupled to the row-select lines in a second order different from the first order, gates of transfer transistors in a third consecutive column of the array for each color are coupled to the row-select lines in a third order different from the first and second orders, and gates of transfer transistors in a fourth consecutive column of the array for each color are coupled to the row-select lines in the first order.

5. The readout wiring architecture of claim 4 wherein:
    in the first consecutive column, the gate of the transfer transistor for a first color detector is coupled to a first row-select line, the gate of the transfer transistor for a second color detector is coupled to a second row-select line, and the gate of the transfer transistor for a third color detector is coupled to a third row-select line;
    in the second consecutive column, the gate of the transfer transistor for the first color detector is coupled to the second row-select line, the gate of the transfer transistor for the second color detector is coupled to the third row-select line, and the gate of the transfer transistor for the third color detector is coupled to the first row-select line;
    in the third consecutive column, the gate of the transfer transistor for the first color detector is coupled to the third row-select line, the gate of the transfer transistor for the second color detector is coupled to the first row-select line, and the gate of the transfer transistor for the third color detector is coupled to the second row-select line; and
    in the fourth consecutive column, the gate of the transfer transistor for the first color detector is coupled to the first row-select line, the gate of the transfer transistor for the second color detector is coupled to the second row-select line, and the gate of the transfer transistor for the third color detector is coupled to the third row-select line.

6. The readout wiring architecture of claim 1 wherein:
    for each ith row in the array, the transfer transistors in each jth column of the array for each color are coupled to the row-select lines in a first order and the transfer transistors in each j+1)th column of the array for each color are coupled to the row-select lines in a second order different from the first order; and
    for each (i+1)th row in the array, the transfer transistors in each jth column of the array for each color are coupled to the row-select lines in the first order and the transfer transistors in each (j+1)th column of the array for each color are coupled to the row-select lines in a third order different from the first and second orders.

7. The readout wiring architecture of claim 1 wherein:
the gates of the transfer transistors in an ith row of the array for a first color and a second color alternate between a first row select line and a second row select line in adjacent columns of the array, and the gates of the transfer transistors in the ith row of the array for a third color are coupled to a third row select line for all columns in the array; and the gates of the transfer transistors in an (i+1)th row of the array for the first color are coupled to a first row select line for all columns in the array, and the gates of the transfer transistors in the (i+1)th row of the array for the second color and the third color alternate between a second row select line and a third row select line in adjacent columns of the array.

8. The readout wiring architecture of claim 1 wherein:
the array of vertical detector color pixel sensors is disposed on a semiconductor body;
each vertical detector color pixel sensor includes at least a first individual color sensor and a second individual color sensor, the first and second individual color sensors disposed at different depths below a surface of the semiconductor body;
the first individual color sensor is electrically connected to a first plug that conducts captured photocharge from the first individual color sensor to a first location on the surface of the semiconductor body;
the second individual color sensor is electrically connected to a second plug that conducts captured photocharge from the second individual color sensor to a second location on the surface of the semiconductor body spaced apart from the first location;
the first and second locations are different for at least some of vertical detector color pixel sensors in each row of the array.

9. The readout wiring architecture of claim 8 wherein the first and second locations are opposite one another in adjacent vertical detector color pixel sensors in each row of the array.

10. In an array including rows and columns of vertical detector color pixel sensors, each vertical detector color pixel sensor disposed in a row and column of the array and having individual color detectors for a number of colors, a readout wiring architecture comprising:
a plurality of row-select lines for each row of the array, the number of row-select lines equal to the number of colors in the vertical detector color pixel sensors in the array;
an individual column line for each column of the array;
a transfer transistor for each individual color detector in each vertical detector color pixel sensor in the array, each transfer transistor coupled between a color detector in a column of the array and a column line of the array, each transfer transistor having a gate coupled to one of the plurality of row-select lines in a row of the array in which the vertical detector color pixel sensor is disposed;
wherein the transfer transistors for each color detector in a vertical detector color pixel sensor in a column of the array are coupled to a different one of the column line immediately preceding the column line in which the vertical detector color pixel sensor is disposed, the column line in which the vertical detector color pixel sensor is disposed, and the column line immediately following the column line in which the vertical detector color pixel sensor is disposed.

11. The readout wiring architecture of claim 10 in which:
the transfer transistor for a first color detector in a vertical detector color pixel sensor in a column of the array is coupled to the column line immediately preceding the column line in which the vertical detector color pixel sensor is disposed;
the transfer transistor for a second color detector in a vertical detector color pixel sensor in a column of the array is coupled to the column line in which the vertical detector color pixel sensor is disposed; and
the transfer transistor for a third color detector in a vertical detector color pixel sensor in a column of the array is coupled to the column line immediately following the column line in which the vertical detector color pixel sensor is disposed.

12. A method for operating in a video mode an array containing rows and columns of vertical detector color pixel sensors, each vertical detector color pixel sensor having individual red, green, and blue color detectors, each column of the array having a single common column output line, each red color detector in a vertical detector color pixel sensor in a column of the array coupled to the common column output line through a red transfer transistor, each green color detector in a vertical detector color pixel sensor in a column of the array coupled to the common column output line through a green transfer transistor, each blue color detector in a vertical detector color pixel sensor in a column of the array coupled to the common column output line through a blue transfer transistor, gates of each red transfer transistor in a row of the array coupled to a red transfer row line, gates of each green transfer transistor in a row of the array coupled to a green transfer row line, gates of each blue transfer transistor in a row of the array coupled to a blue transfer row line, the method comprising:
sequentially turning on the red and green transfer transistors in every ith row of the array; and
sequentially turning on the green and blue transfer transistors in every (i+8)th row of the array.

* * * * *